(12) United States Patent
Komori et al.

(10) Patent No.: US 8,723,247 B2
(45) Date of Patent: May 13, 2014

(54) SEMICONDUCTOR MEMORY DEVICE AND METHOD FOR MANUFACTURING SAME

(75) Inventors: Yosuke Komori, Mie-ken (JP); Daigo Ichinose, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 13/218,972

(22) Filed: Aug. 26, 2011

(65) Prior Publication Data

US 2012/0211820 A1 Aug. 23, 2012

(30) Foreign Application Priority Data

Feb. 22, 2011 (JP) .................. 2011-035566

(51) Int. Cl.
*H01L 29/792* (2006.01)
*H01L 21/28* (2006.01)

(52) U.S. Cl.
USPC .... 257/324; 257/330; 257/331; 257/E29.309; 438/588

(58) Field of Classification Search
USPC .................................. 257/330–332
See application file for complete search history.

(56) References Cited

U.S. PATENT DOCUMENTS

| 7,847,334 | B2 | 12/2010 | Katsumata et al. | |
|---|---|---|---|---|
| 7,936,004 | B2 | 5/2011 | Kito et al. | |
| 2007/0111422 | A1* | 5/2007 | Lutze et al. | 438/201 |
| 2008/0116507 | A1* | 5/2008 | Ino et al. | 257/324 |
| 2009/0242967 | A1* | 10/2009 | Katsumata et al. | 257/324 |
| 2010/0207195 | A1 | 8/2010 | Fukuzumi et al. | |
| 2011/0033995 | A1* | 2/2011 | Katsumata et al. | 438/268 |
| 2012/0032249 | A1* | 2/2012 | Matsuda | 257/324 |

FOREIGN PATENT DOCUMENTS

JP 2011-249803 12/2011

OTHER PUBLICATIONS

Office Action mailed Jul. 26, 2013, in Japanese Patent Application No. 2011-035566 Feb. 22, 2011 (with English Translation).

* cited by examiner

*Primary Examiner* — Marcos D. Pizarro
*Assistant Examiner* — Quinton Brasfield
(74) *Attorney, Agent, or Firm* — Oblon, Spivak, McClelland, Maier & Neustadt, L.L.P.

(57) ABSTRACT

According to one embodiment, a semiconductor memory device includes a plurality of gate electrode films arranged parallel to each other along a direction, a semiconductor member extending in the direction, and passing through the plurality of gate electrode films, and a charge storage film provided between the gate electrode films and the semiconductor member. Protrusions are provided projecting along the direction at the ends of the gate electrode films in opposition to the semiconductor member. A gaseous layer is formed in a part of a gap between the gate electrode films.

8 Claims, 28 Drawing Sheets

SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2011-035566, filed on Feb. 22, 2011; the entire contents of which are incorporated herein by reference.

FIELD

Embodiments described herein relate generally to a semiconductor memory device and a method for manufacturing the same.

BACKGROUND

In recent years, non-volatile semiconductor memory devices, in particular flash memory, have been used for various applications, and greater capacities are being required. Therefore with the progressive acceleration of miniaturization of memory cells, a limitation in processing is being approached. In a construction in which memory cells and circuit elements are disposed on a plane, as in conventional devices, the only way to achieve large scale integration of memory cells is by miniaturization, but there is a limit to that miniaturization. To solve this problem, flash memory has been proposed, which has a 3-dimensional construction with the memory cells, which were conventionally disposed on a plane, disposed in a direction normal to the top surface of a substrate.

However, in this type of memory device with the memory cells disposed in 3-dimensions, the distance between electrodes for driving the memory cells becomes smaller, so the parasitic capacitance of the electrodes increases. Therefore time is required for potential control of the electrodes due to the CR delay, resulting in the problem that it is difficult to speed up operation.

DETAILED DESCRIPTION

In general, according to one embodiment, a semiconductor memory device includes a plurality of gate electrode films arranged parallel to each other along a direction, a semiconductor member extending in the direction, and passing through the plurality of gate electrode films, and a charge storage film provided between the gate electrode films and the semiconductor member. Protrusions are provided projecting along the direction at the ends of the gate electrode films in opposition to the semiconductor member. A gaseous layer is formed in a part of a gap between the gate electrode films.

Hereinafter, embodiments of the invention will be explained below with reference to the drawings.

First, a first embodiment will be explained.

Figure 1:
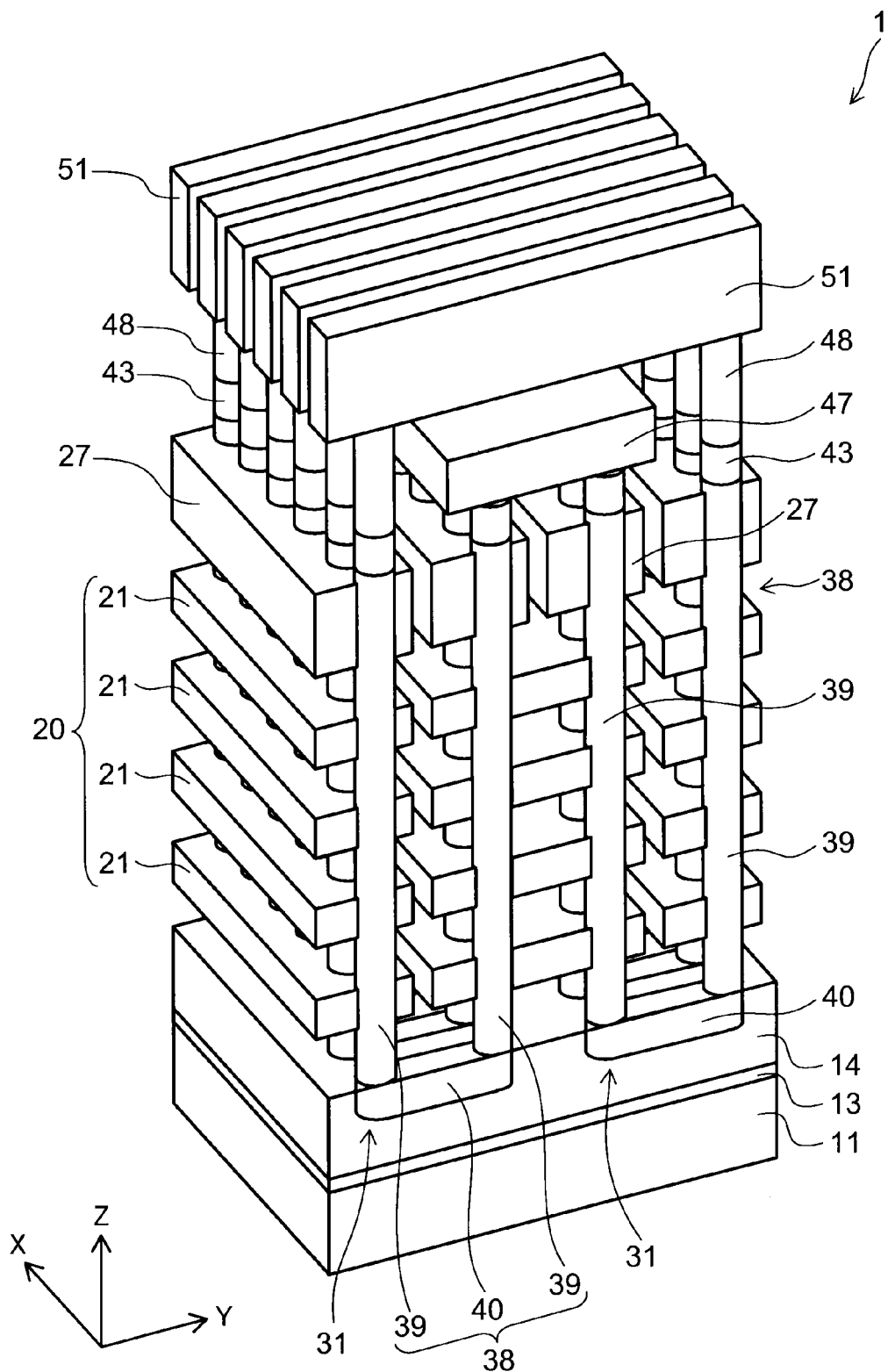
FIG. 1 is a perspective view illustrating a semiconductor memory device according to a first embodiment.

FIG. 1 is a perspective view illustrating a semiconductor memory device according to the embodiment.

Figure 2:
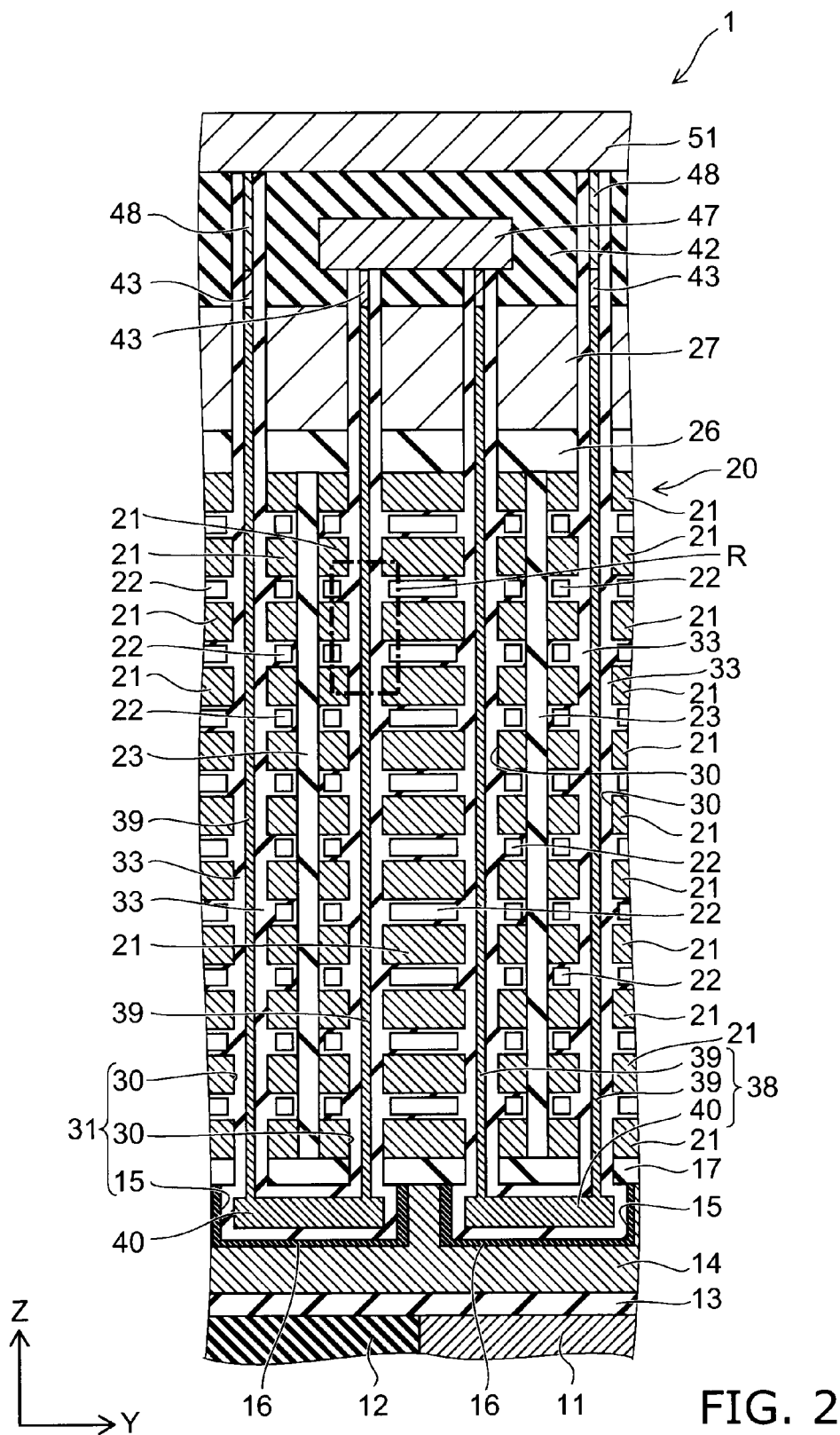
FIG. 2 is a cross-sectional view illustrating the semiconductor memory device according to the first embodiment.

FIG. 2 is a cross-sectional view illustrating the semiconductor memory device according to the embodiment.

Figure 3:
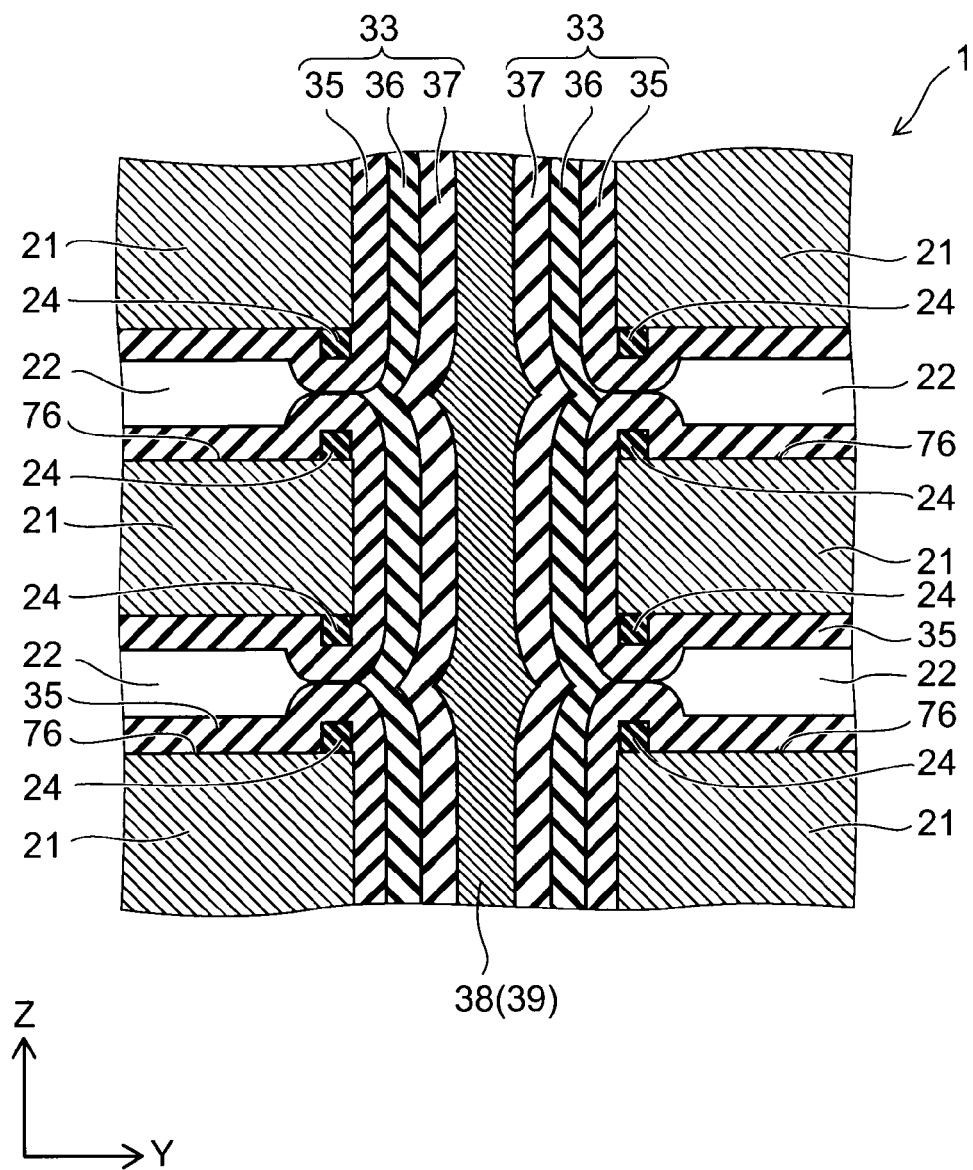
FIG. 3 is a partially enlarged cross-sectional view illustrating an area R shown in FIG. 2.

FIG. 3 is a partially enlarged cross-sectional view illustrating an area R shown in FIG. 2.

Figure 4:
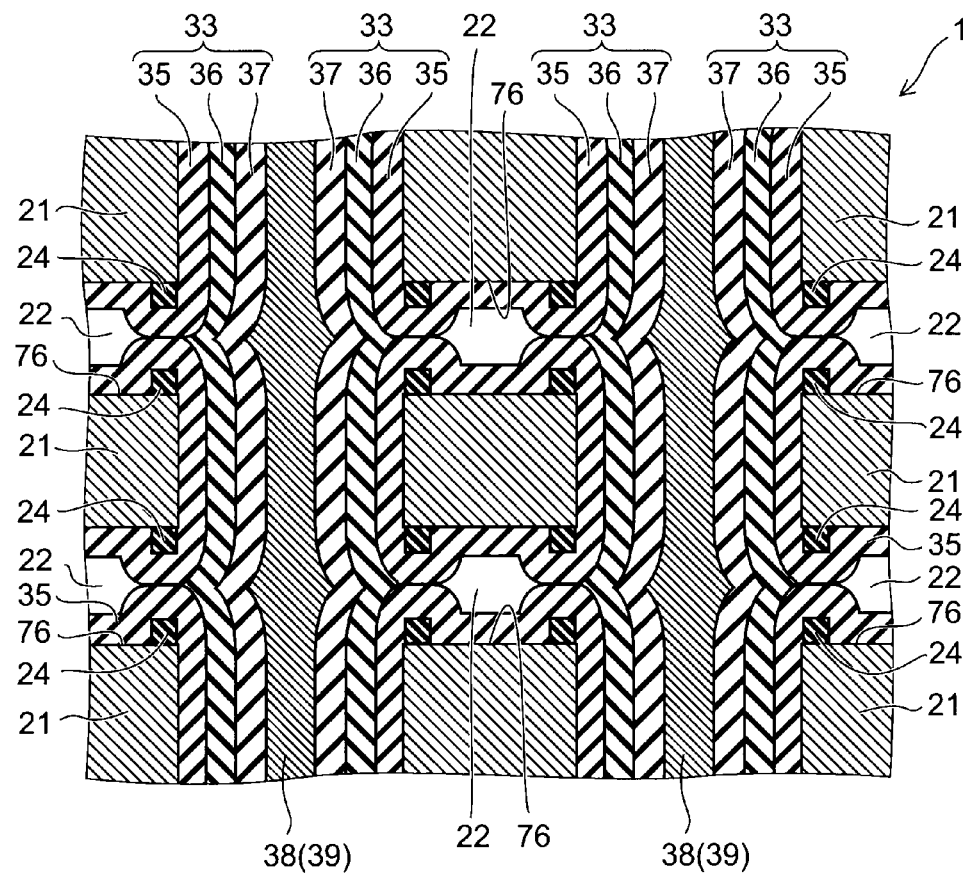
FIG. 4 is a partially enlarged cross-sectional view illustrating the semiconductor memory device according to the first embodiment.

FIG. 4 is a partially enlarged cross-sectional view illustrating the semiconductor memory device according to the embodiment.

In FIG. 1, as a rule, for ease of illustration, only the conductive parts are illustrated, and the insulating parts are omitted. Also, in FIG. 1, a gate electrode film 21 is illustrated with only four layers, and in FIG. 2, the gate electrode film 21 is illustrated having 11 layers, but the number of stacked layers of the gate electrode film 21 is arbitrary.

As illustrated in FIGS. 1 and 2, a semiconductor memory device 1 according to the embodiment (hereafter also referred to simple as "device 1") includes a silicon substrate 11.

In this patent specification, the following XYZ orthogonal co-ordinate system is introduced for convenience of explanation. In this co-ordinate system, two mutually orthogonal directions parallel to the top surface of the silicon substrate 11 are defined as the "X-direction" and the "Y direction", and the direction orthogonal to both the X direction and the Y direction is defined as the "Z direction", in other words the vertical direction.

A shallow trench isolation (STI) 12 is selectively formed in a top layer part of the silicon substrate 11. Also, a silicon oxide film 13 is formed on the silicon substrate 11, and a back gate electrode film 14 made from an electrically conducting material, for example silicon doped with phosphorous (phosphorous doped silicon), is provided thereupon. A plurality of approximately rectangular parallelepiped shaped depressions 15 is formed in the top layer part of the back gate electrode film 14 extending in the Y direction, and a low permittivity insulating film, for example a silicon oxide film 16 is provided on the inner surfaces of the depressions 15. The shape of the depressions 15 may be an inverted rectangular frustum with the bottom surface smaller than the top surface. Also, a silicon oxide film 17 is provided on the back gate electrode film 14.

A voided structural body 20 is provided on the silicon oxide film 17. A plurality of gate electrode films 21 is provided in the voided structural body 20. The gate electrode films 21 are made from silicon into which boron is introduced (boron doped silicon), whose shapes are strip shapes extending in the X direction, and are arranged in a matrix along the Y direction and Z direction. Also, the ends of the voided structural body 20 are processed into a stairs shape, with the gate electrode films 21 arranged in the Z direction constituting the steps. The gate electrode films 21 are the word lines of the device 1.

In the Z direction, the gate electrode films 21 are mutually separated from each other, and a part of the gap between the gate electrode films 21 forms a gaseous layer 22. The gaseous layer 22 is constituted from a gas such as air, dried nitrogen, an inert gas, or the like. The gaseous layer 22 may be completely isolated from the surroundings in a gastight state, or it may be linked to the surroundings. If it is in the gastight state, the pressure of the gaseous layer 22 may be lower than atmospheric pressure, or it may be higher than atmospheric pressure.

Between adjacent gate electrode films 21 in the Y direction, an insulating plate member 23 made from, for example, a silicon oxide, is provided. The shape of the insulating plate member 23 is a plate shape extending in the X direction and Z direction, and the insulating plate member 23 penetrates the voided structural body 20. Also, a silicon oxide film 26 is provided on the voided structural body 20, and a plurality of control electrodes 27 made from boron doped silicon that extends in the X direction is provided on the silicon oxide film 26.

Also, a plurality of through holes 30 that extend in the Z direction are formed in the voided structural body 20, the silicon oxide film 26, and the control electrodes 27. The through holes 30 are arranged in a matrix form in the X direction and the Y direction, pass through the control electrodes 27, the silicon oxide film 26, and the voided structural body 20, and reach both ends of the depressions 15 in the Y direction. In this way, pairs of through holes 30 that are adjacent to each other in the Y direction are linked by the depressions 15, and constitute a single U-shaped hole 31. The shape of each through hole 30 is, for example, a circular cylindrical shape, and the shape of each U-shaped hole 31 is generally U-shaped. Also, each gate electrode film 21 is penetrated by two rows of through holes 30 along the X direction. The arrangement of depressions 15 and the arrangement of gate electrode films 21 in the Y direction have the same period of arrangement but their phases are shifted by half a period, so each row of the two rows of through holes 30 that penetrate each gate electrode film 21 belong to mutually different U-shaped holes 31.

As illustrated in FIGS. 3 and 4, protrusions 24 that project in the Z direction are provided in the ends of the gate electrode films 21 in opposition to the through holes 30. The shape of the protrusions 24 is a ring shape that surrounds the through holes 30. The protrusions 24 are formed from, for example, a silicon oxide. Also, a block insulating film 35 is provided on the inner surfaces of the U-shaped hole 31. The block insulating film 35 is a film through which a current does not substantially flow even when a voltage that is within the driving voltage range of the device 1 is applied, and is formed from a high permittivity material, for example a material having a higher permittivity than the material that forms a charge storage film 36, which is described later, for example, formed from a silicon oxide. Note that the film construction of the block insulating film 35 is not limited to a single layer construction constituted from one type of film only, but may have a stacked construction in which a plurality of types of films is stacked.

The block insulating film 35 wraps around from the inner surfaces of the through holes 30 to the top and bottom surfaces of the gate electrode films 21, covering the top and bottom surfaces of the gate electrode films 21, and also covering the protrusions 24. Of the part of the block insulating film 35 that covers the top surface of the gate electrode films 21, the part that covers the protrusions 24 projects higher than the other parts. Also, of the part of the block insulating film 35 that covers the bottom surface of the gate electrode films 21, the part that covers the protrusions 24 projects lower than the other parts. Therefore, in the block insulating films 35, of two gate electrode films 21 that are adjacent in the Z direction, the part that covers the region of the bottom surface of the upper gate electrode film 21 apart from the protrusions 24, and the part that covers the region of the top surface of the bottom gate electrode film 21 apart from the protrusions 24 are separated from each other, and between these the gaseous layer 22 as described above is formed. On the other hand, in the block insulating films 35, the part that covers the protrusions 24 provided on the bottom surface of the upper gate electrode film 21, and the part that covers the protrusions 24 provided on the top surface of the bottom gate electrode film 21 are in contact with each other, so they form a cylindrical-shaped wall that partitions the through holes 30 from the gaseous layers 22. Also, in the block insulating films 35, of the surfaces facing the center lines of the through holes 30, in the region corresponding to the center in the Z direction of the gaseous layers 22, depressions are formed that reflect the block insulating films 35 penetrating into the gaps between the gate electrode films 21.

The charge storage film 36 is provided on the block insulating film 35. The charge storage film 36 is a film capable of accumulating charge, for example, a film that includes electron trap sites, such as a silicon nitride film. In the embodiment, the charge storage film 36 is disposed on the inside of the U-shaped holes 31 only, and does not penetrate into the gaps between gate electrodes 21 that are adjacent in the Z direction.

A tunnel insulating film 37 is provided on the charge storage film 36. The tunnel insulating film 37 is a film that is normally insulating, but when a predetermined voltage that is within the driving voltage range of the device 1 is applied, a tunnel current flows, and is formed from a silicon oxide, for example. The tunnel insulating film 37 is also disposed on the inside of the U-shaped holes 31 only, and does not penetrate into the gaps between gate electrodes 21 that are adjacent in the Z direction. Note that the film construction of the tunnel insulating film 37 is not limited to a single layer construction constituted from one type of film only, but may have a stacked construction in which a plurality of types of films is stacked. A memory film 33 is formed by laminating the block insulating film 35, the charge storage film 36 and the tunnel insulating film 37.

The insides of the U-shaped holes 31 are filled with a polysilicon into which an impurity, for example, boron (B) is introduced, forming U-shaped pillars 38. The shape of the U-shaped pillars 38 is a U-shape that reflects the shape of the U-shaped holes 31. The U-shaped pillars 38 are in contact with the tunnel insulating film 37. Of the U-shaped pillars 38, the parts disposed within the through holes 30 form silicon pillars 39 as semiconductor material, and the parts disposed within the depressions 15 form connection parts 40. The shape of the silicon pillars 39 is a cylindrical shape that reflects the shape of the through holes 30, and the shape of the connection parts 40 is an approximately rectangular parallelepiped shape that reflects the shape of the depressions 15, for example an inverted rectangular frustum shape. The polysilicon may completely fill the inside of the U-shaped holes 31 forming pillar shaped U-shaped pillars 38, or it may be filled with a void remaining along the central axis to form pipe shaped U-shaped pillars 38. Also, this void may be partially or completely filled with an insulating material such as silicon nitride or the like.

A silicon nitride film (not shown in the drawings) is provided on the side surfaces of the voided structural body 20 that has been processed into a stairs shape, on the side surfaces of the silicon oxide film 26, and on the side surfaces of the control electrodes 27. The silicon nitride film is formed in a stairs shape that reflects the shape of the ends of the voided structural body 20. Also, as illustrated in FIG. 2, an inter-layer insulating film 42 made from, for example, a silicon oxide, is provided on the control electrodes 27 and the silicon nitride film, embedding the voided structural body 20.

Plugs 43 are embedded within the inter-layer insulating film 42. The plugs 43 are disposed in the region directly above the silicon pillars 39, and are connected to the silicon pillars 39. Also, within the inter-layer insulating film 42, a source line 47 and a plug 48 are embedded in the part higher than the plug 43. The source line 47 extends in the X direction, and is connected to one of the pair of silicon pillars 39 that belongs to the U-shaped pillars 38 via the plug 43. The plug 48 is connected to the other one of the pair of silicon pillars 39 that belongs to the U-shaped pillars 38 via the plug 43. A bit line 51 that extends in the Y direction is provided on the inter-layer insulating film 42, and is connected to the plug 48.

In the device 1, a memory cell transistor is formed at the intersecting portions of the gate electrode films 21 and the silicon pillars 39, and selection transistors are formed at the intersecting portions of the control electrodes 27 and the silicon pillars 39. In this way, a memory string is constituted by the plurality of memory cell transistors connected in series between the bit line 51 and the source line 47, with selection transistors connected at both sides.

Next, a manufacturing method for the semiconductor memory device according to the first embodiment will be described.

FIGS. 5A through 14B illustrate a method of manufacturing the semiconductor memory device according to the embodiment, in each figure, A is a plan view of a process, and B is a cross-sectional view of the process at the line A-A' in A, and FIGS. 15 through 19 are process cross-sectional views illustrating the method of manufacturing the semiconductor memory device according to the embodiment, illustrating the area around a memory cell.

Figure 5A:
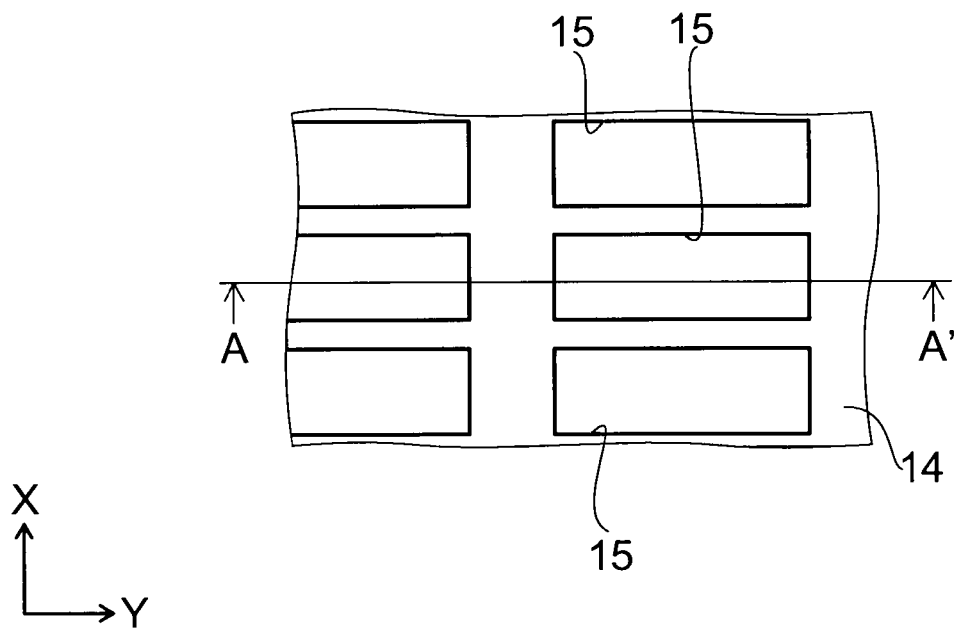
FIGS. 5A through 14B illustrate a method of manufacturing the semiconductor memory device according to the first embodiment.
Figure 5B:
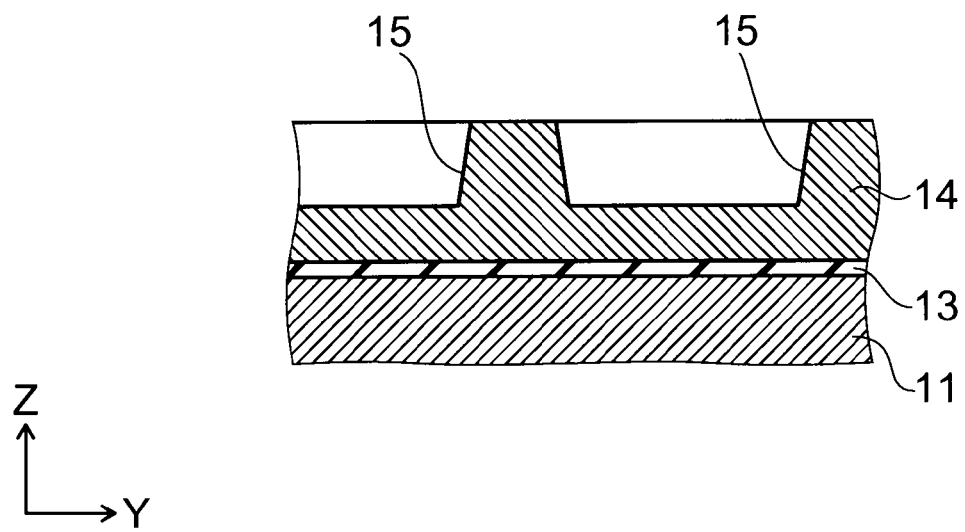

First, the silicon substrate 11 is prepared, as illustrated in FIGS. 5A and 5B. Then the STI 12 (see FIG. 2) is selectively formed in the top layer portion of the silicon substrate 11. Next, transistors are formed in the nearby circuit region (not shown in the drawings). Also, the silicon oxide film 13 is formed on the top surface of the silicon substrate 11. Next, the back gate electrode film 14 is formed by forming a film made from phosphorous doped silicon, and selectively removing it. Next, the depressions 15 are formed with an approximately rectangular parallelepiped shape, for example an inverted rectangular frustum shape, on the top surface of the back gate electrode film 14 with the Y direction as the long direction, using the photolithography method. The depressions 15 are formed in a plurality of regions, arranged in a matrix form in the X direction and Y direction.

Figure 6A:
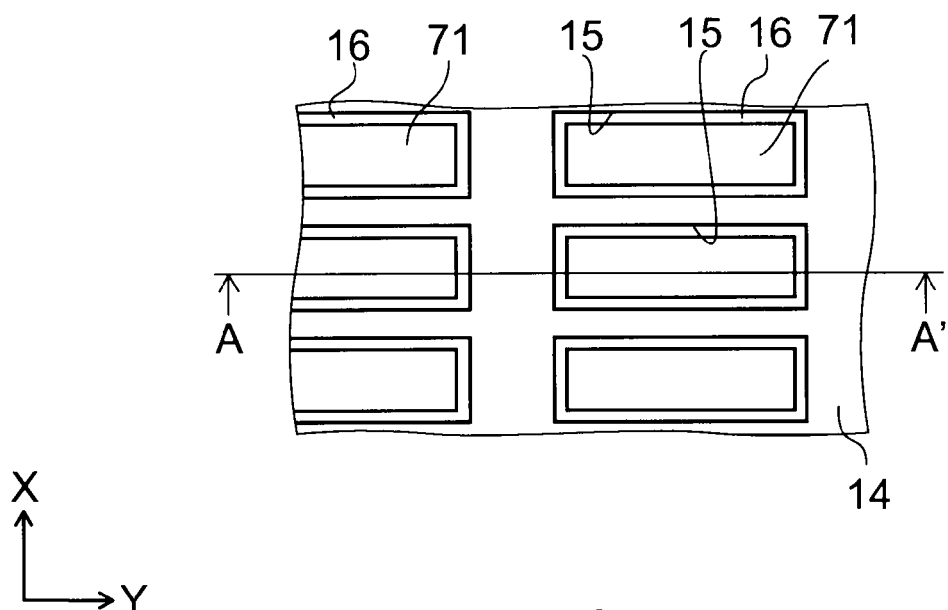
Figure 6B:
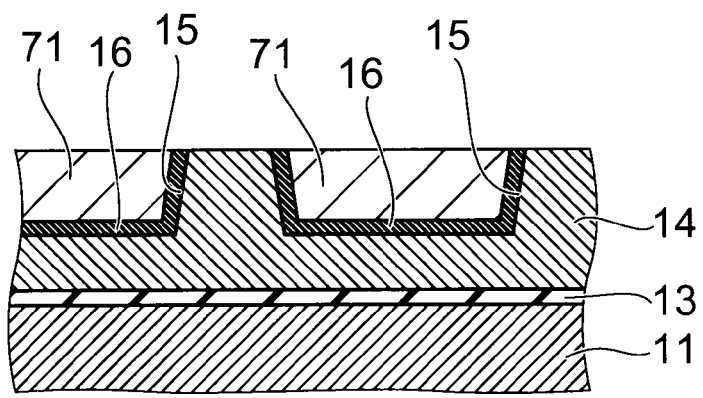

Next, the silicon oxide film 16 is formed on the inner surfaces of the depressions 15, as illustrated in FIGS. 6A and 6B. Next, silicon into which impurities have not been introduced (non-doped silicon) is deposited, and the whole surface is etched. In this way, the non-doped silicon is removed from the top surface of the back gate electrode film 14, and remains within the depressions 15. As a result, the region between the depressions 15 is exposed on the top surface of the back gate electrode film 14, and non-doped silicon material 71 fills the interior of the depressions 15.

Figure 7A:
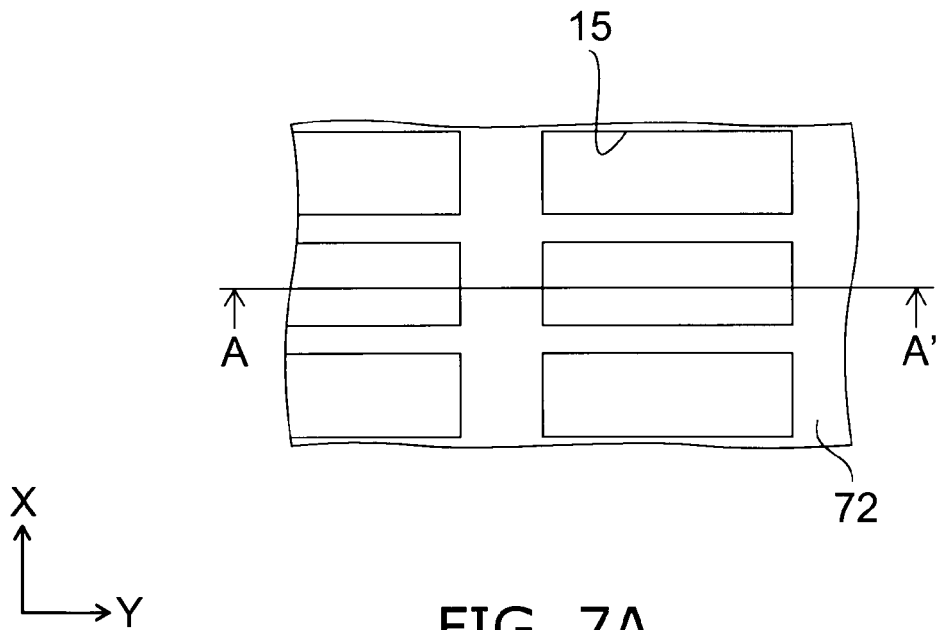
Figure 7B:
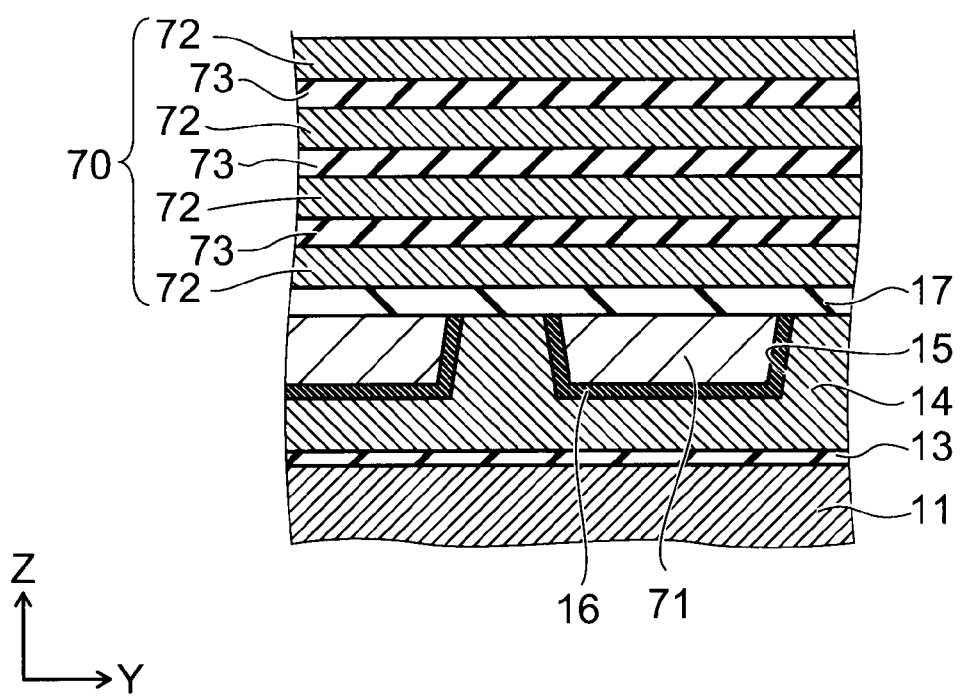
Figure 15:
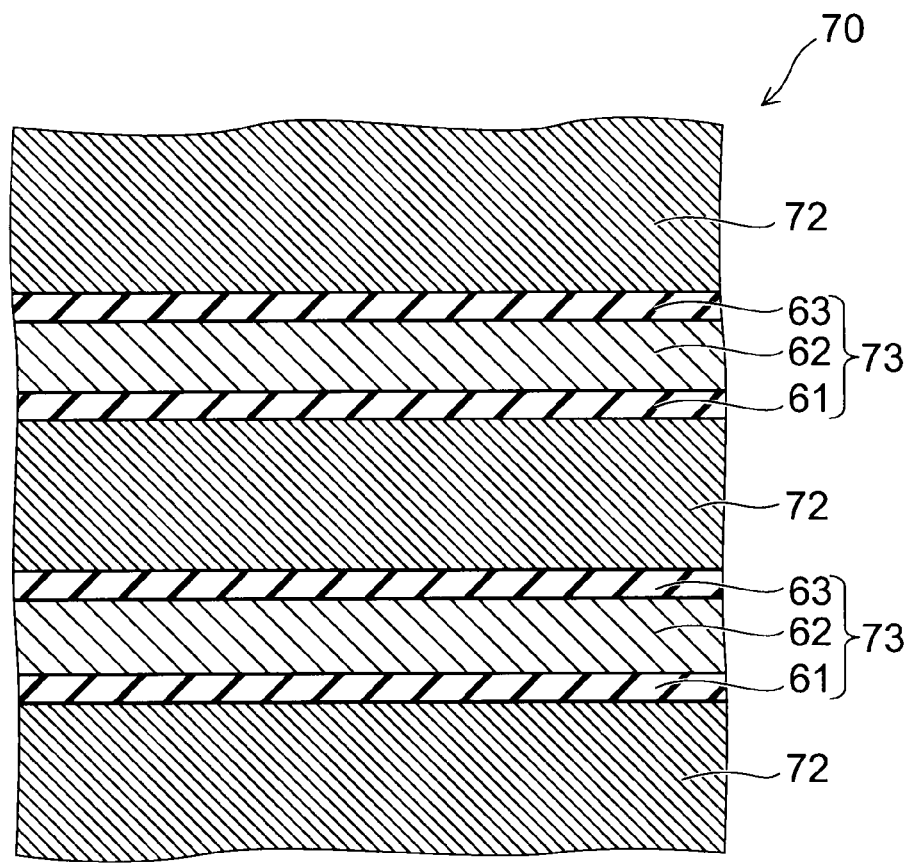
FIGS. 15 through 19 are process cross-sectional views illustrating the method of manufacturing the semiconductor memory device according to the first embodiment, illustrating the area around a memory cell.

Next, the silicon oxide film 17 is formed on the whole top surface of the back gate electrode film 14, as illustrated in FIGS. 7A and 7B. The film thickness of the silicon oxide film 17 is sufficient to be able to ensure the withstand voltage between the back gate electrode film 14 and the lowest level of the gate electrode film 21 that is formed on the silicon oxide film 17 in a subsequent process, and to function as a stopper when forming slits 74 (see FIGS. 8A and 8B) that are described later. Next, a boron doped polysilicon film 72 made from polysilicon into which boron has been introduced and a sacrificial film 73 are formed alternately, to form a stacked body 70. At this time, as illustrated in FIG. 15, each sacrificial film 73 is formed by depositing subsequently a silicon nitride film 61 made from a silicon nitride, a non-doped polysilicon film 62 made from polysilicon into which impurities are not introduced, and a silicon nitride film 63.

Figure 8A:
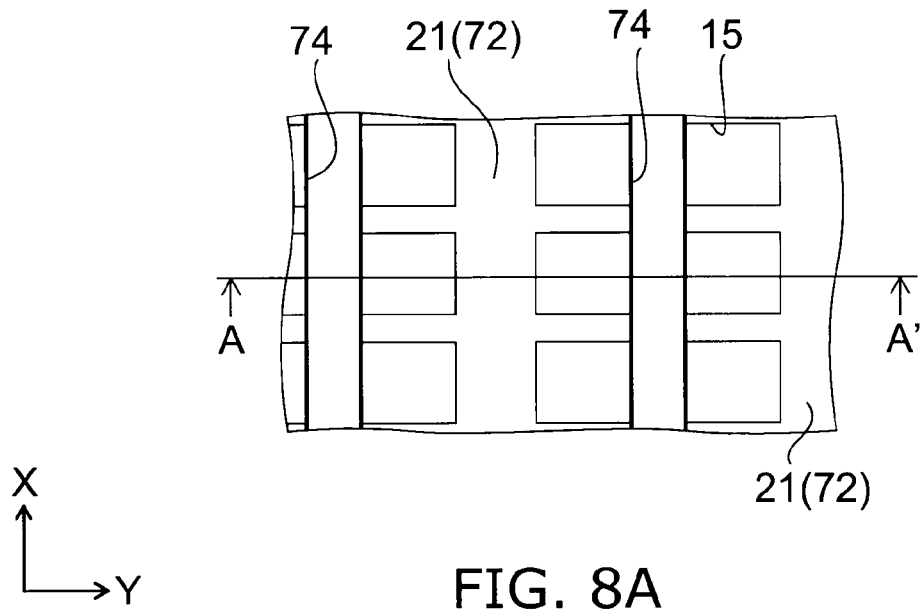
Figure 8B:
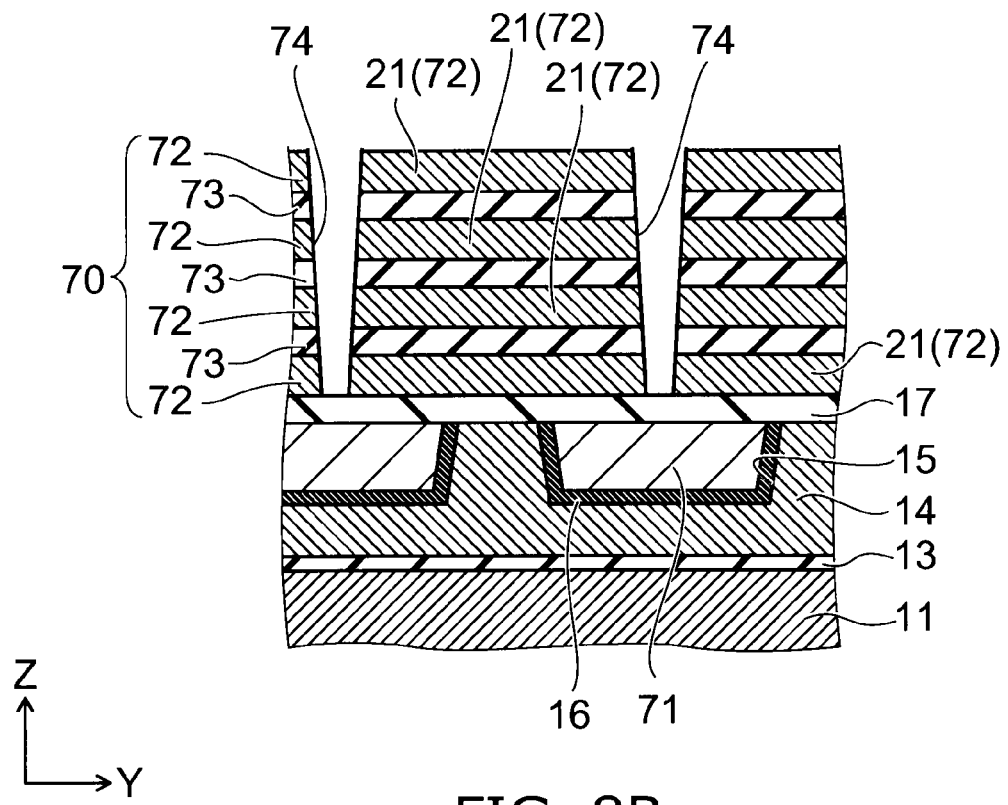

Next, photolithography and etching are performed to form the plurality of slits 74 that extends in the X direction on the stacked body 70 from the top surface thereof, as illustrated in FIGS. 8A and 8B. Each slit 74 penetrates the stacked body 70 in the Z direction, formed so as to pass through the region directly above the center of the depressions 15 in the Y direction. In this way, the boron doped silicon film 72 is divided into a plurality of gate electrode films 21.

Figure 9A:
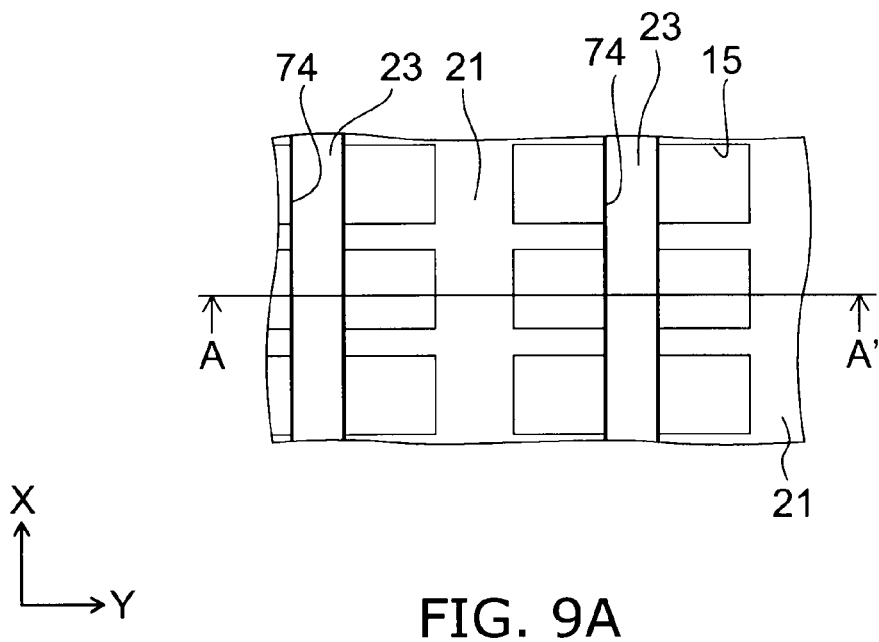
Figure 9B:
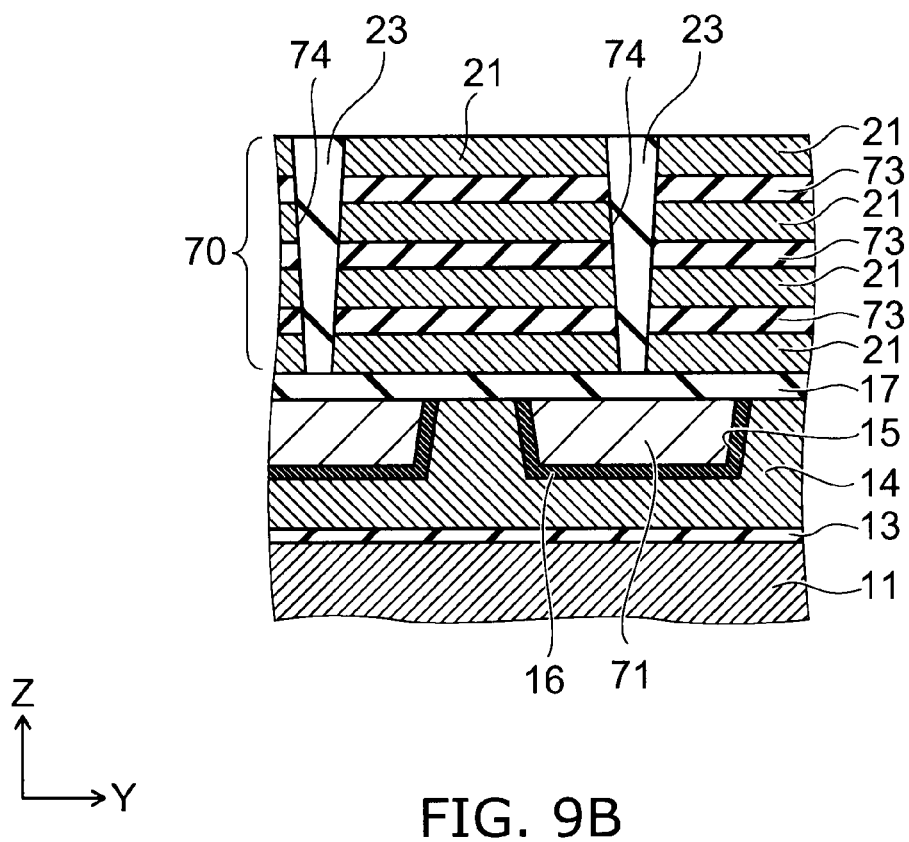

Next, an insulating material such as a silicon oxide or the like is deposited over the whole surface, as illustrated in FIGS. 9A and 9B. At this time, this insulating material also fills the slits 74. Then, etching is performed over the whole surface, and the insulating material is removed from the top surface of the stacked body 70, and allowed to remain within the slits 74. In this way, plate shaped insulating plate members 23 are formed within the slits 74 extending in the X direction and the Z direction. Also, the topmost level of the gate electrode film 21 is exposed on the top surface of the stacked body 70.

Figure 10A:
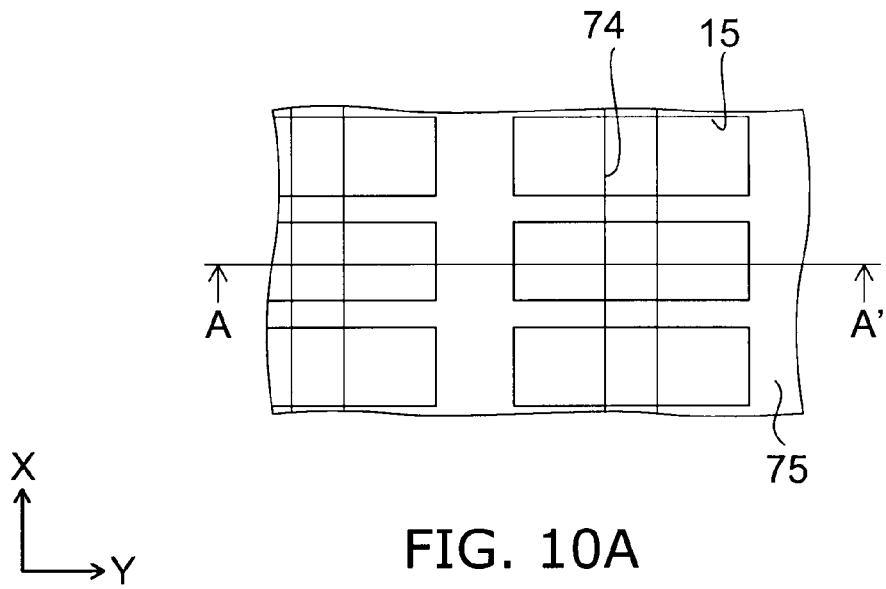
Figure 10B:
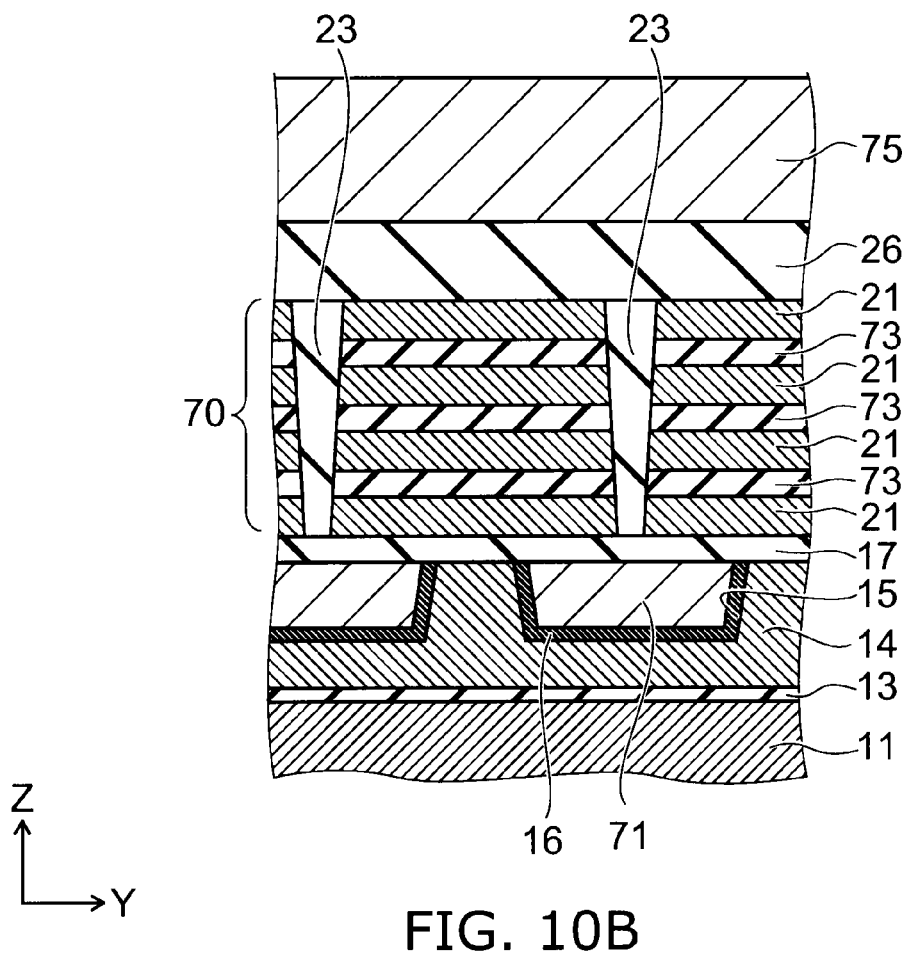

Next, the silicon oxide film 26 is formed on the stacked body 70, and a boron doped polysilicon film 75 is formed on the silicon oxide film 26, as illustrated in FIGS. 10A and 10B. At this time, the film thickness of the silicon oxide film 26 is sufficient to ensure the withstand voltage between the topmost level of the gate electrode 21 and the boron doped polysilicon film 75.

Figure 11A:
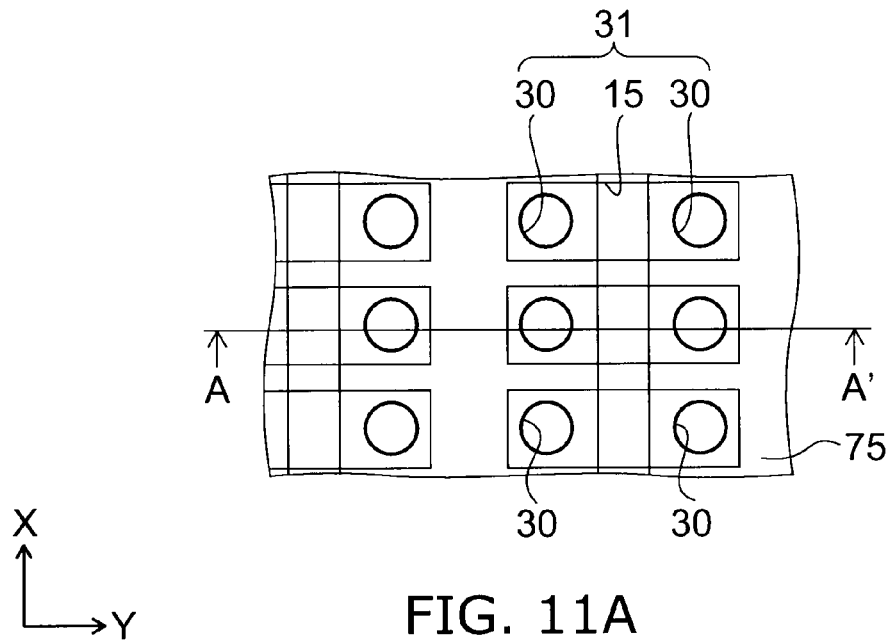
Figure 11B:
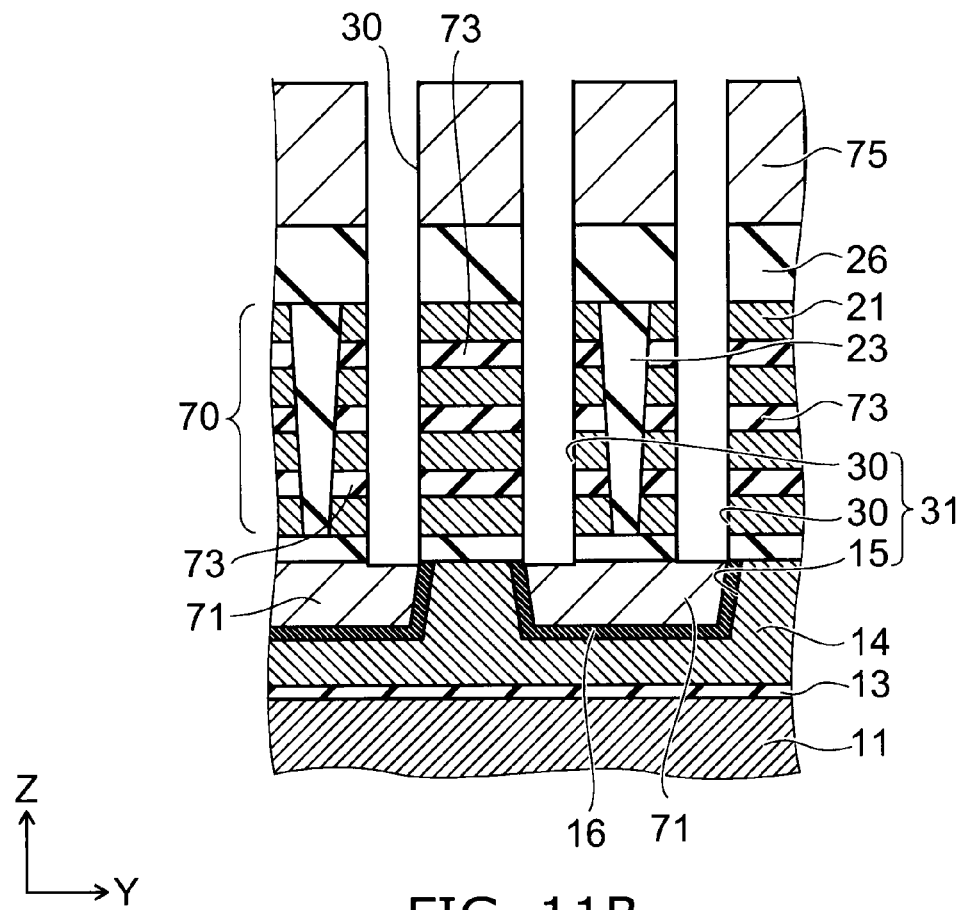
Figure 16:
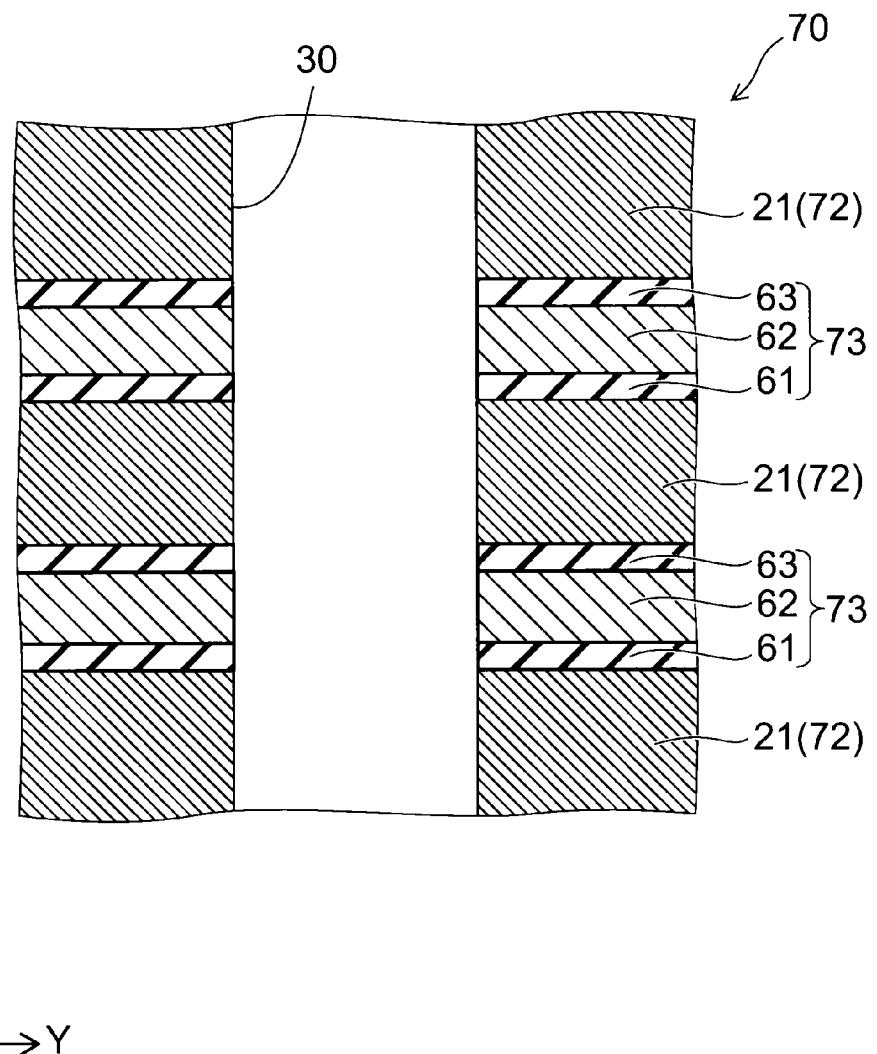

Next, the plurality of through holes 30 extending in the Z direction is formed by photolithography and etching so as to penetrate the boron doped polysilicon film 75, the silicon oxide film 26, and the stacked body 70, as illustrated in FIGS. 11A, 11B, and 16. The through holes 30 are formed in a circular shape when viewed from the Z direction. Also, the through holes 30 are arranged in a matrix form along the X direction and the Y direction, and in the Y direction adjacent pairs of through holes 30 reach both ends of the depressions 15 in the Y direction. In this way, a pair of through holes 30 is linked to both ends of a single depression 15, forming the U-shaped hole 31.

Figure 12A:
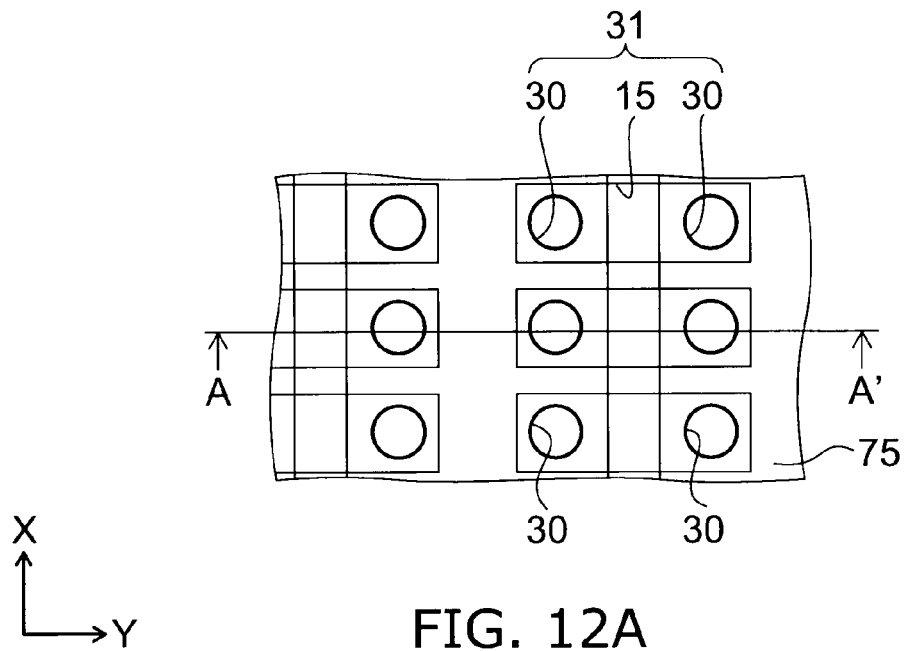
Figure 12B:
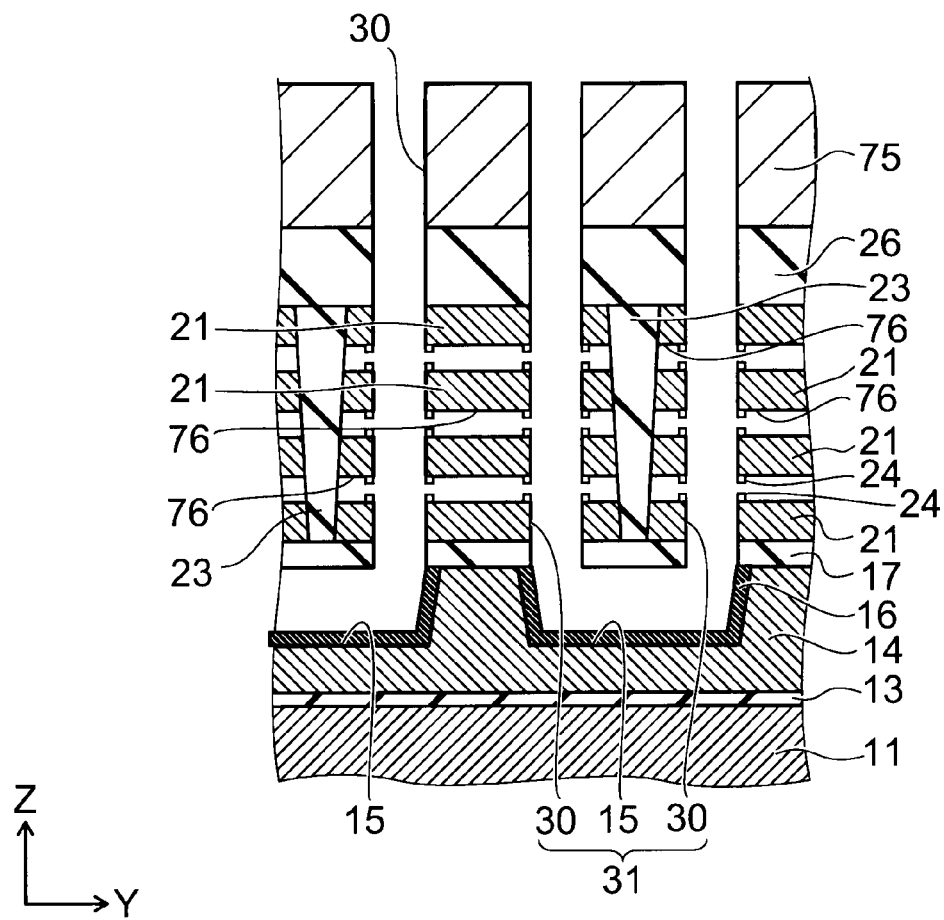
Figure 13A:
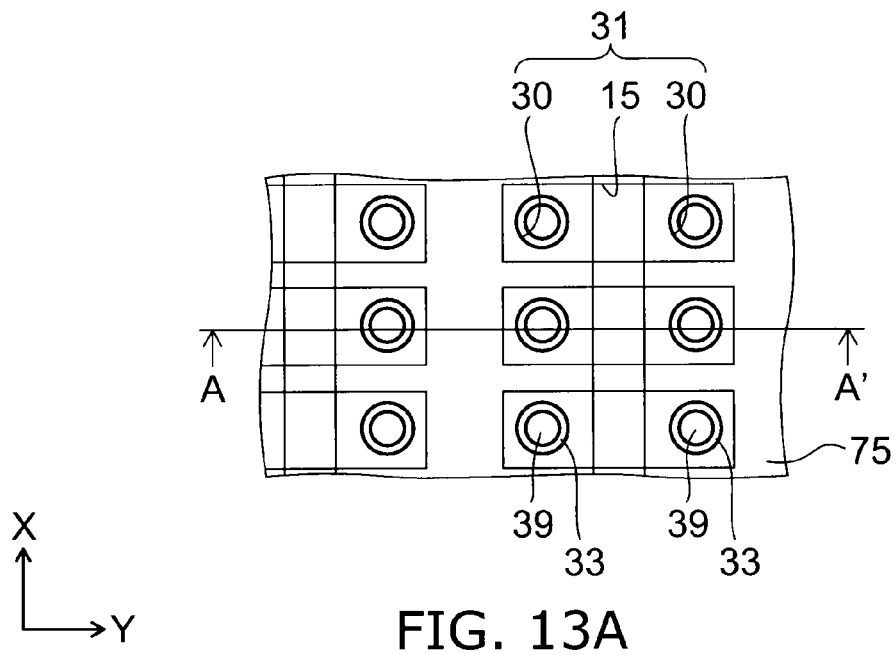
Figure 13B:
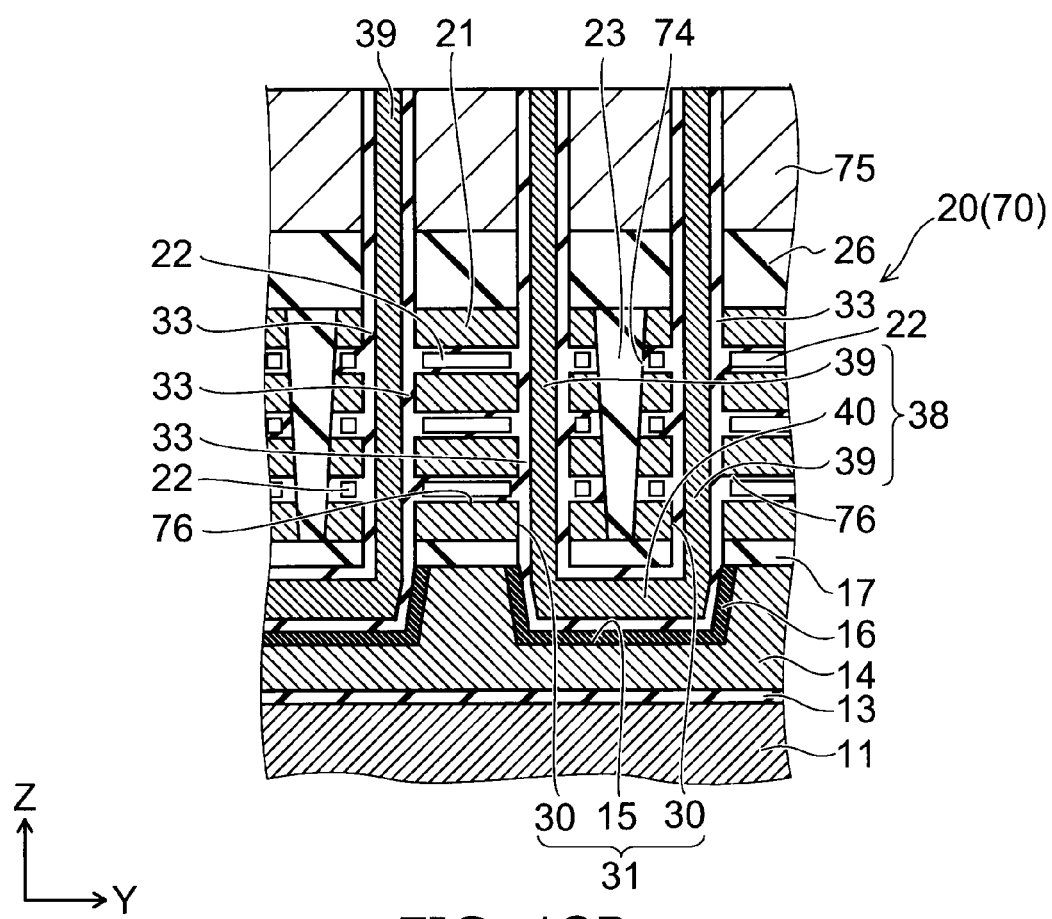

Next, the non-doped silicon material 71 filling the insides of the depressions 15 is removed, as illustrated in FIGS. 12A and 12B. Also, the sacrificial film 73 is removed, and the protrusions 24 are formed. Specifically, the processes illustrated in FIGS. 17 through 19 are performed.

Figure 17:
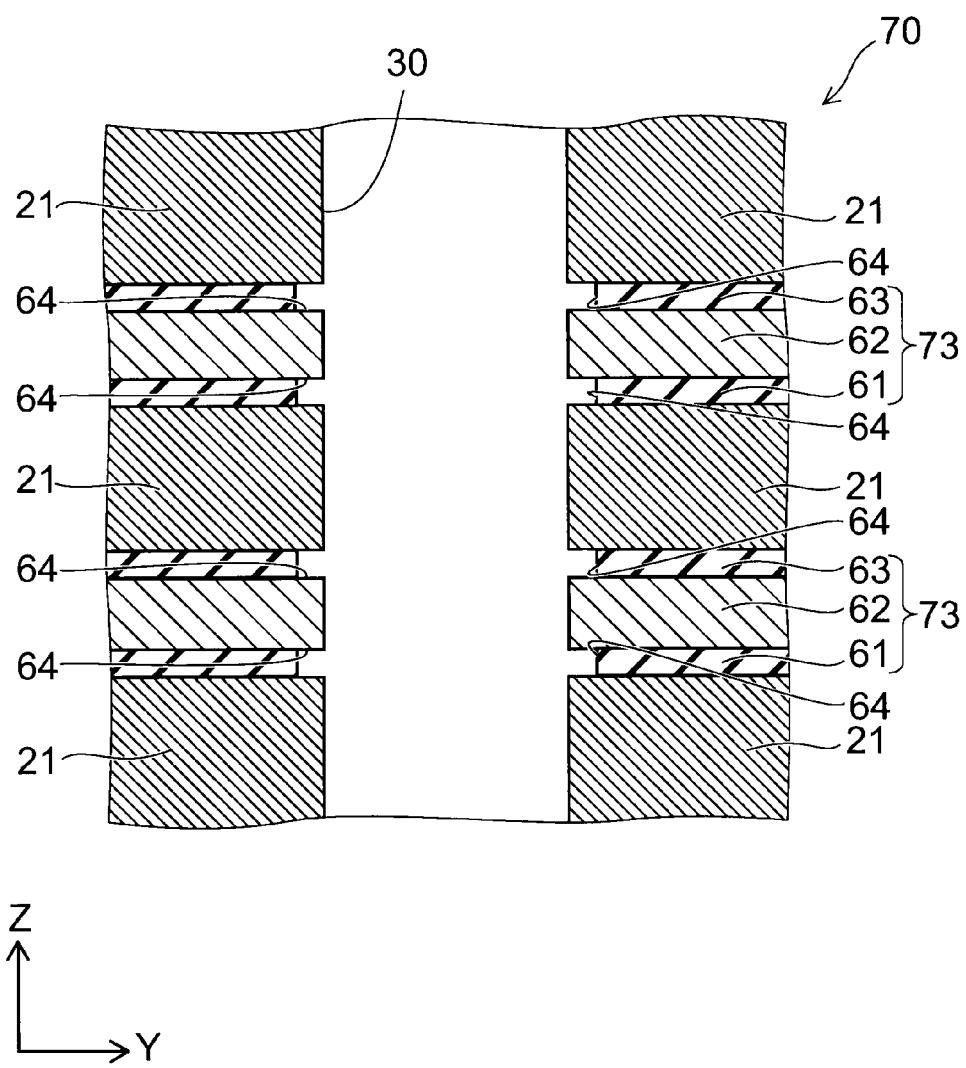

That is, as illustrated in FIG. 17, etching is performed via the through holes 30, and the silicon nitride films 61 and 63 are recessed from the inner surface of the through holes 30. This etching is isotropic, and is performed under the condition that the etching speed of the silicon nitride films 61 and 63 is sufficiently higher than the etching speed of the gate electrode films 21 made from boron doped polysilicon and the non-doped polysilicon film 62. For example, wet etching using phosphoric acid is performed. In this way, indentations 64 are formed on the inner surfaces of the through holes 30.

Figure 18:
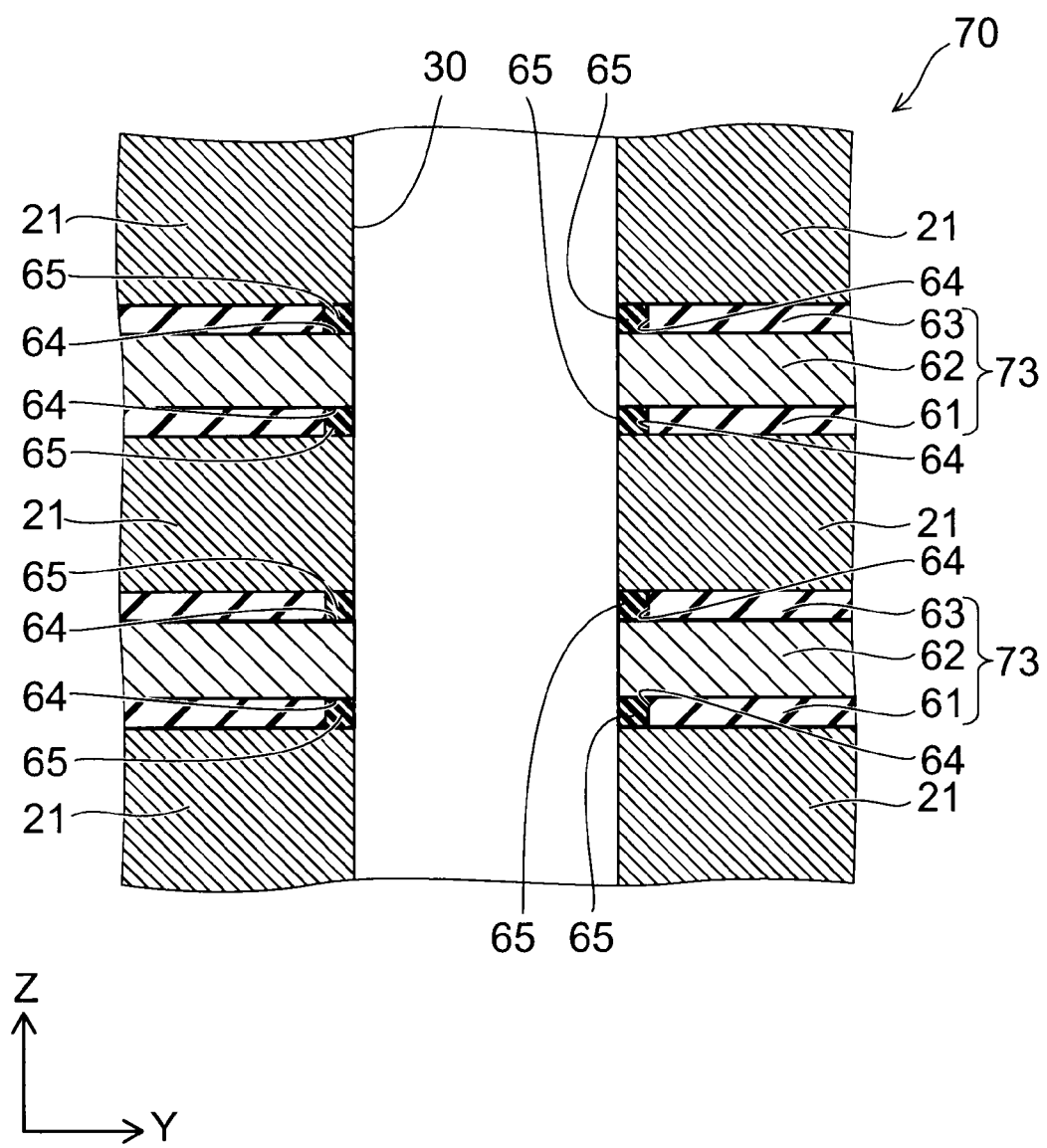

Next, an insulating material, for example a silicon oxide 65 is deposited on the inner surfaces of the through holes 30, as illustrated in FIG. 18. This insulating material is an insulating material that is different from the silicon nitride that forms the silicon nitride films 61 and 63. Also, the deposition method is an isotropic method that fills well, for example the low pressure chemical vapor deposition (LPCVD) method. In addition, the quantity of silicon oxide 65 deposited is sufficient to fill the indentations 64. Next, isotropic etching such as wet etching using hydrofluoric acid or chemical dry etching (CDE), for example, is performed, to etch back the silicon oxide 65. In this way, the part of the silicon oxide 65 deposited on the inner surfaces of the through holes 30 apart from the indentations 64 is removed, and only the part deposited in the indentations 64 remains.

Figure 19:
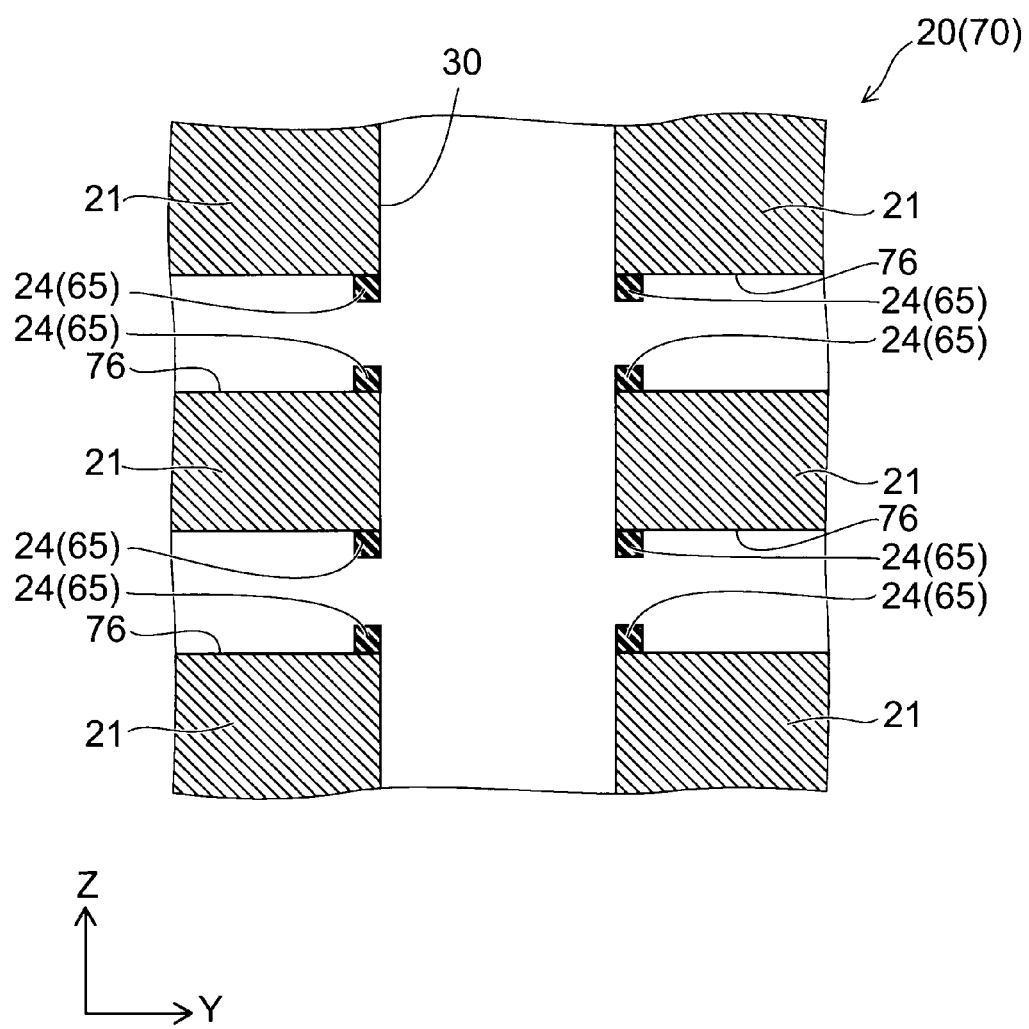

Next, wet etching is performed via the through holes 30 and the non-doped silicon material 71 (see FIG. 11B) and the non-doped polysilicon film 62 (see FIG. 18) are removed, as illustrated in FIG. 19. At this time, an alkaline etching liquid, such as TMY having corrin as the main component, is used as the etching liquid, for example. Next, wet etching is performed using phosphoric acid, for example, and the silicon nitride films 61 and 63 (see FIG. 18) are removed. At this time, the part of the silicon oxide 65 remaining within the indentations 64 (see FIG. 18) is not removed, but forms the protrusions 24. In this way, the sacrificial film 73 is removed, and the protrusions 24 are formed protruding along the Z direction on the gate electrode films 21 at the ends in opposition to the through holes 30. Also, gaps 76 are formed between the gate electrode films 21 in the Z direction. As a result, the ends of the gaps 76 at the through hole 30 sides have a constricted shape due to the pairs of opposing protrusions 24 in the Z direction. Also, as illustrated in FIGS. 12A and 12B, the gate electrode films 21 are supported by the plate shaped insulating plate members 23.

Next, a silicon oxide is deposited by, for example, atomic layer deposition (ALD) method, as illustrated in FIGS. 13A, 13B, 3, and 4. At this time, the quantity of silicon oxide deposited is equivalent to not less than half the distance between the opposing protrusions 24 in the Z direction. This silicon oxide penetrates into the U-shaped holes 31, and is deposited on the inner surfaces of the U-shaped holes 31, forming the block insulating film 35. Further, this silicon oxide also penetrates into the gaps 76 via the through holes 30, and the silicon oxide is also deposited on the inner surfaces of the gaps 76, in other words, on the top and bottom surfaces of the gate electrode films 21 and the surfaces within the gaps 76 exposed at the insulating plate members 23, forming the block insulating film 35. At this time, the block insulating film 35 covers the protrusions 24, so before the block insulating film 35 completely fills within the gaps 76, the parts where the block insulating films 35 cover the opposing pairs of protrusions 24 come into contact with each other. In this way, the parts of the gaps 76 that are sandwiched by the protrusions 24 become blocked by the block insulating film 35. Then the part within the gaps 76 that remains without being filled by the block insulating film 35 remains as it is without being filled, and becomes the gaseous layer 22. In this way, the stacked body 70 becomes the voided structural body 20.

Next, the silicon nitride is deposited. In this way, the charge storage film 36 is formed on the block insulating film 35. At this time, looking from the through hole 30, the entries to the gaps 76 are blocked by the block insulating film 35, so the charge storage film 36 does not enter into the gaps 76, but is formed only in the U-shaped holes 31. Next, a silicon oxide film is deposited. In this way, the tunnel insulating film 37 is formed on the charge storage film 36. The tunnel insulating film 37 does not enter into the gaps 76, but is formed only in the U-shaped hole 31. The memory film 33 is formed by the block insulating film 35, the charge storage film 36, and the tunnel insulating film 37. When forming the memory film 33, the voided structural body 20 is inevitably heated.

Next, the U-shaped holes 31 are filled with polysilicon that includes an impurity, for example, boron. In this way, the U-shaped pillars 38 whose shape is a U-shape are formed within the U-shaped holes 31. Of the U-shaped pillars 38, the parts disposed within the through holes 30 form silicon pillars 39 extending in the Z direction, and the parts disposed within the depressions 15 form connection parts 40 extending in the Y direction. Then, all the surfaces are etched, and the polysilicon, the tunnel insulating film 37, the charge storage film 36, and the block insulating film 35 deposited on the boron doped polysilicon film 75 are removed, and the boron doped polysilicon film 75 is exposed.

Figure 14A:
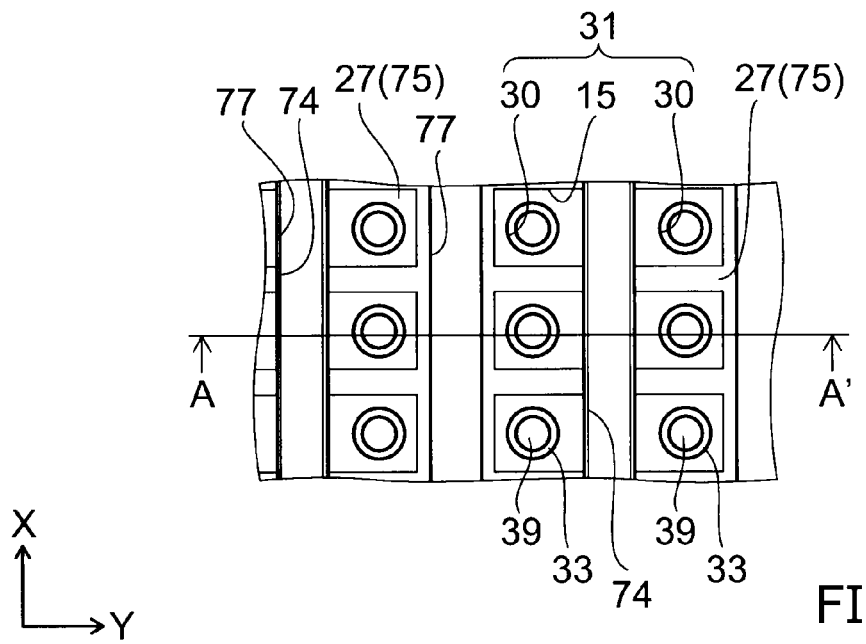
Figure 14B:
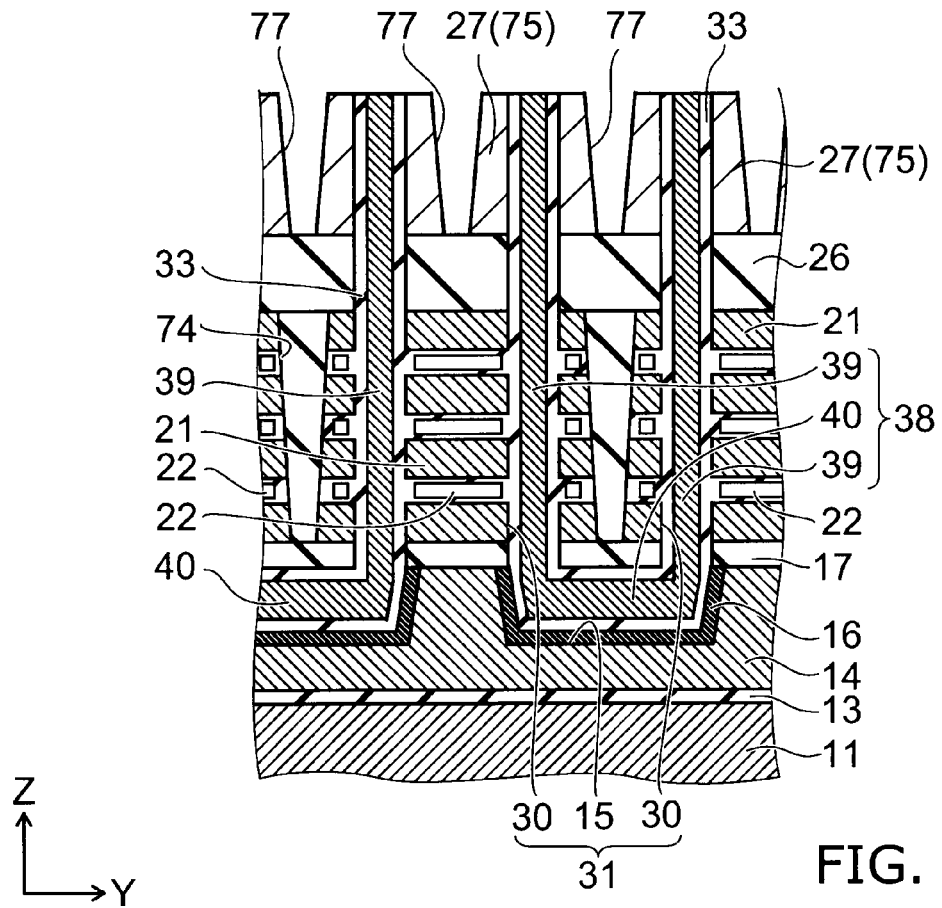

Next, as illustrated in FIGS. 14A and 14B, photolithography and etching are performed, and a plurality of slits 77 extending in the X direction is formed in the boron doped polysilicon film 75 from the top surface thereof. At this time, the slits 77 are formed between rows formed by the plurality of through holes 30 arranged in the X direction, and each slit 77 penetrates the boron doped polysilicon film 75 and reaches the silicon oxide film 26. In this way, the boron doped polysilicon film 75 is divided by every row formed by the plurality of through holes 30 arranged in the X direction, to form the plurality of control electrodes 27 extending in the X direction. Then the slits 77 are filled with a silicon oxide.

Next, as illustrated in FIGS. 1 and 2, a resist mask (not shown in the drawings) is formed on the voided structural body 20, and trimming of this resist mask and etching with the resist mask as the mask are performed alternately, so that the ends of the voided structural body 20 and the control electrodes 27 are processed into a stairs shape. Next, a silicon nitride film (not shown in the drawings) is formed on the side surfaces of the voided structural body 20 and the control electrodes 27, and the whole is filled with inter-layer insulating film 42. Next, the plug 43 is formed within the inter-layer insulating film 42. Then, the source line 47 is formed on the inter-layer insulating film 42, further inter-layer insulating film 42 is deposited, and the plug 48 is formed. Next, the bit line 51 is formed on the inter-layer insulating film 42. In this way, the semiconductor memory device 1 according to the embodiment is manufactured.

Next, the effect of the embodiment will be explained.

In the embodiment, in the processes illustrated in FIGS. 17 through 19, the protrusions 24 are formed protruding along the Z direction at the ends of the gate electrode films 21 at the through holes 30 sides. In this way, in the processes illustrated in FIGS. 3 and 4, when the block insulating film 35 is deposited, the ends of the gaps 76 at the through holes 30 sides are blocked by the block insulating film 35, so it is possible to form the gaseous layers 22 within the gaps 76. The permittivity of the gaseous layers 22 is about 1, which is lower than the permittivity of a solid insulating material, so it is possible to reduce the parasitic capacitance between the gate electrode films 21. In this way, when a potential is applied to the gate electrode films 21 to drive the memory cell, it is possible to reduce the occurrence of CR delays.

More specifically, the time required to adjust the gate electrode film 21 to a predetermined potential is proportional to the length of the gate electrode films 21, the resistance per unit length of the gate electrode films 21, and the electrical capacity per unit length between gate electrode films 21. Therefore, in order to reduce the time required to adjust the potential, it is necessary to reduce at least one of these three factors. In the embodiment, by reducing the electrical capacity between the gate electrode films 21, the time required to adjust the potential of the gate electrode films 21 is shortened. As a result, it is possible to reduce the time required to write data to the memory cell and read data from the memory cell, so it is possible to speed up the operation of the semiconductor memory device 1.

Also, as a result of capacitance between adjacent silicon pillars 39, normally when attempting to produce a predetermined potential difference between the adjacent silicon pillars 39, the potential difference produced is smaller than this. In contrast, in the embodiment, the gaseous layers 22 are disposed between the silicon pillars 39, as illustrated in FIG. 4. As a result, it is possible to reduce the capacitance between the adjacent silicon pillars 39. As a result, it is possible to reduce the reduction in potential difference between the silicon pillars 39. This effect is remarkable when the distance between silicon pillars 39 in the X direction is shorter. Therefore, according to the embodiment, it is possible to accurately control the potential of the silicon pillars 39.

In addition, in the embodiment, in the processes illustrated in FIGS. 12 and 17 through 19, after removing the sacrificial films 73, the memory films 33 are formed in the process illustrated in FIG. 13. Therefore, as a result of the heating when forming the memory films 33, the boron included in the boron doped polysilicon film 72 does not diffuse into the non-doped polysilicon film 62 of the sacrificial film 73. Therefore, in the process illustrated in FIG. 19, it is possible to selectively remove the non-doped polysilicon film 62 only.

Further, in the embodiment, the protrusions 24 are formed from insulating material. In this way, when a voltage is applied between the gate electrode film 21 and the silicon pillars 39, it is possible to prevent concentration of electric field at the protrusions 24. Therefore, the reliability of the semiconductor memory device 1 according to the embodiment is high.

Still further, in the embodiment, the entries to the gaps 76 are blocked by the block insulating film 35. Therefore, it is possible to form the block insulating film 35 at the same time as blocking the gaps 76. As a result, it is possible to reduce the cost of manufacturing the semiconductor memory device 1, without increasing the number of processes to provide the gaseous layer 22.

Still further, in the embodiment, the insulating plate members 23 are provided in the region of the connection parts 40 directly above the center in the Y direction. As a result, the gate electrode films 21 arranged along the Y direction are effectively insulated from each other, and it is possible to positively support the gate electrode films 21.

Next a second embodiment will be described.

Figure 20:
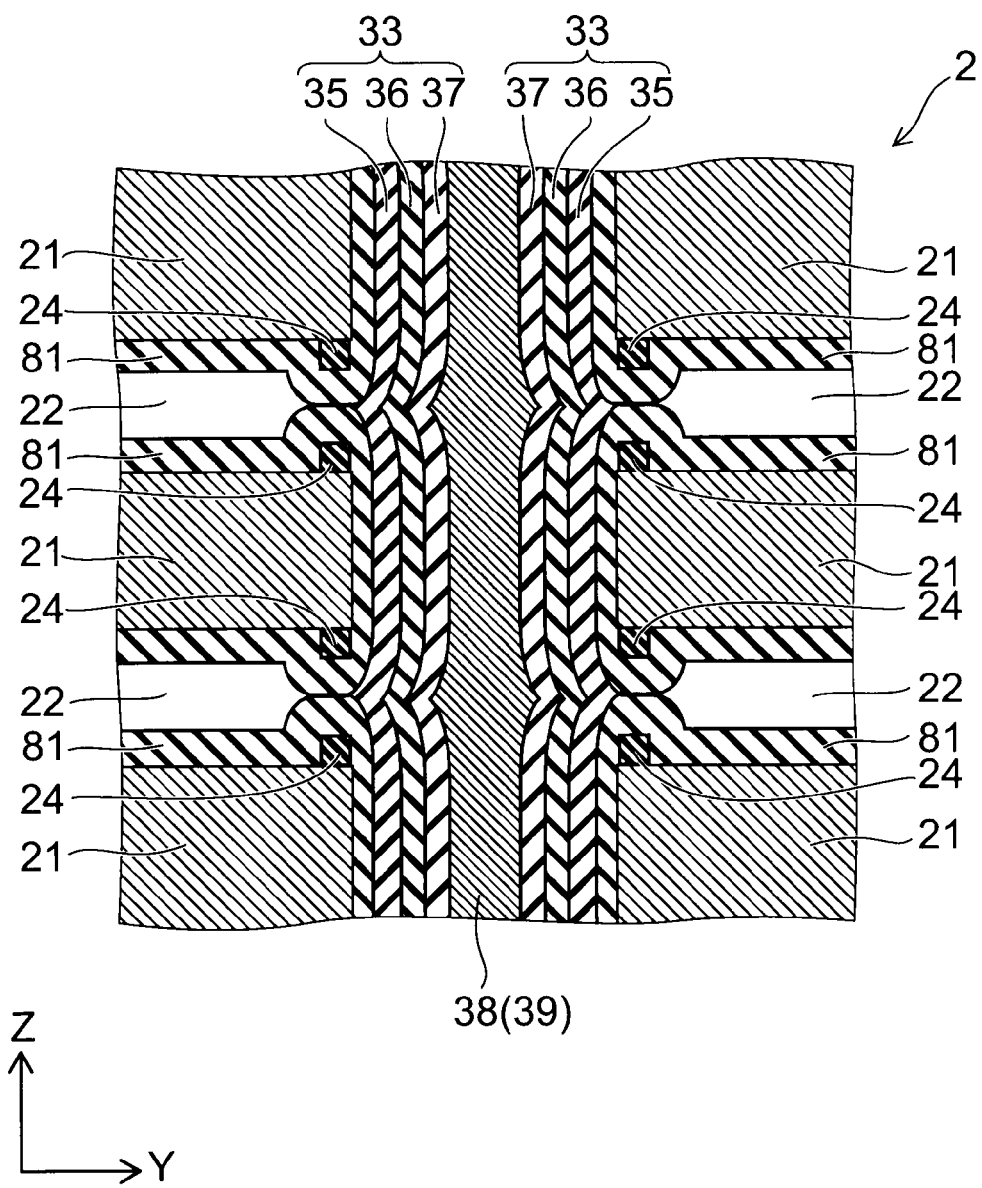
FIG. 20 is a cross-sectional view illustrating an area around a memory cell in a semiconductor memory device according to a second embodiment.

FIG. 20 is a cross-sectional view illustrating an area around a memory cell in the semiconductor memory device according to the embodiment.

As illustrated in FIG. 20, a semiconductor memory device 2 according to the embodiment differs from the semiconductor memory device 1 according to the first embodiment (see FIG. 3) as previously described in that a low permittivity film 81 is provided between the gate electrode film 21 and the block insulating film 35, and the protrusions 24 are covered by the low permittivity film 81, not by the block insulating film 35. The permittivity of the material that forms the low permittivity film 81 is lower than that of the material that forms the block insulating film 35, for example a silicon oxide. Also, the top and bottom surfaces of the gate electrode films 21 are covered with the low permittivity film 81, and the gaps 76 are blocked by the low permittivity film 81 at the part where it covers the protrusions 24. Therefore, the block insulating film 35 does not penetrate into the gaps 76.

This semiconductor memory device 2 can be manufactured by depositing low permittivity material on the inner surfaces of the through holes 30 prior to forming the block insulating film 35 to form the low permittivity film 81. In this case, the block insulating film 35 is formed on the low permittivity film 81, so it does not penetrate into the gaps 76.

According to the embodiment, the low permittivity film 81 is disposed between the gate electrode films 21, not the block insulating film 35, so parasitic capacitance between the gate electrode films 21 is further reduced, and it is possible to further speed up the operation of the semiconductor memory device. Also, the capacitance between the silicon pillars 39 is further reduced, so the potential of the silicon pillars 39 can be more accurately controlled. The configuration, manufacturing method and effect of the embodiment other than that described above is the same as the first embodiment as described previously.

Next, a third embodiment will be described.

Figure 21:
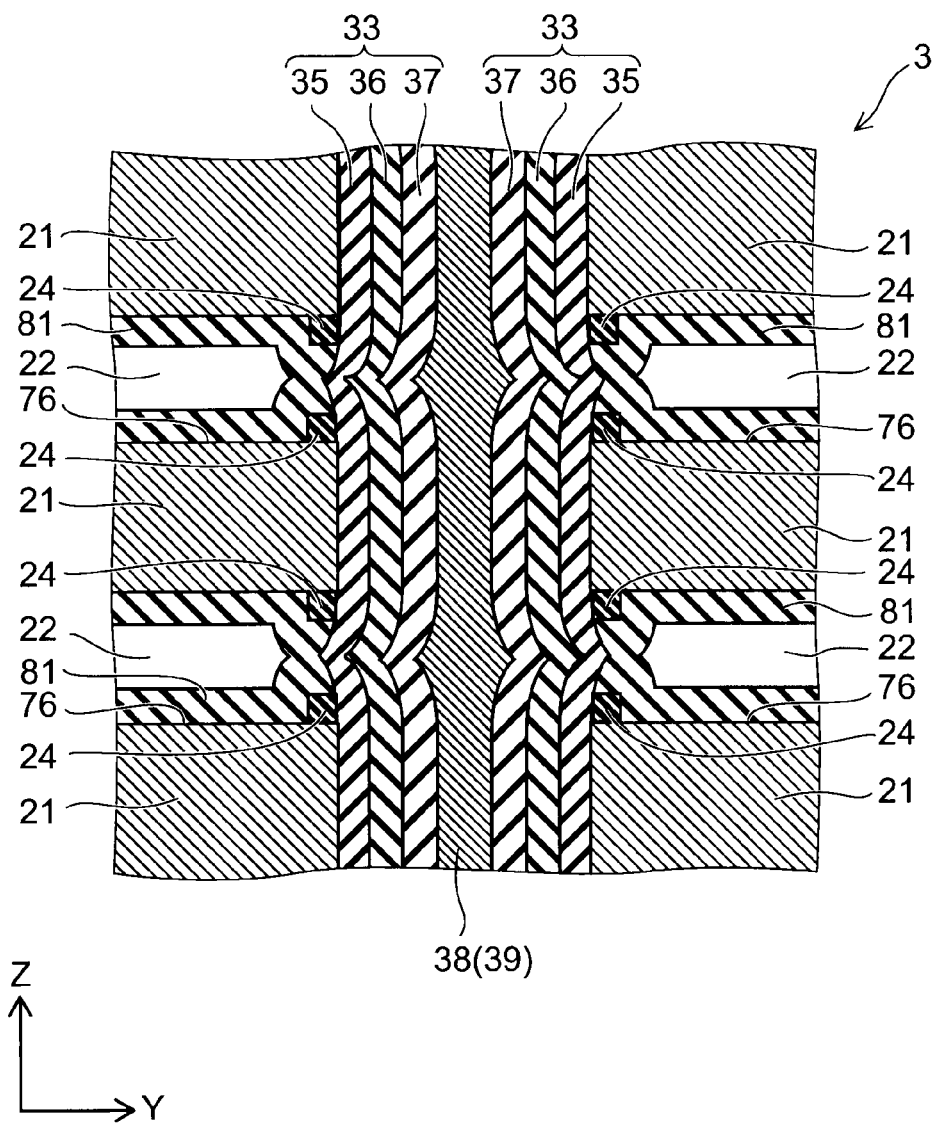
FIG. 21 is a cross-sectional view illustrating an area around a memory cell in a semiconductor memory device according to a third embodiment.

FIG. 21 is a cross-sectional view illustrating an area around a memory cell in a semiconductor memory device according to the embodiment.

As illustrated in FIG. 21, a semiconductor memory device 3 according to the embodiment differs from the semiconductor memory device 2 according to the second embodiment (see FIG. 20) as previously described in that the low permittivity film 81 is disposed only between the gate electrode films 21, and is not disposed within the through holes 30. In this way, the low permittivity film 81 blocks the space between the protrusions 24, but the surfaces within the through holes 30 exposed at the protrusions 24 are in contact with the block insulating film 35. In other words, the protrusions 24 are in contact with both the low permittivity film 81 and the block insulating film 35.

Next, a manufacturing method for the semiconductor memory device according to the third embodiment will be described.

Figure 22:
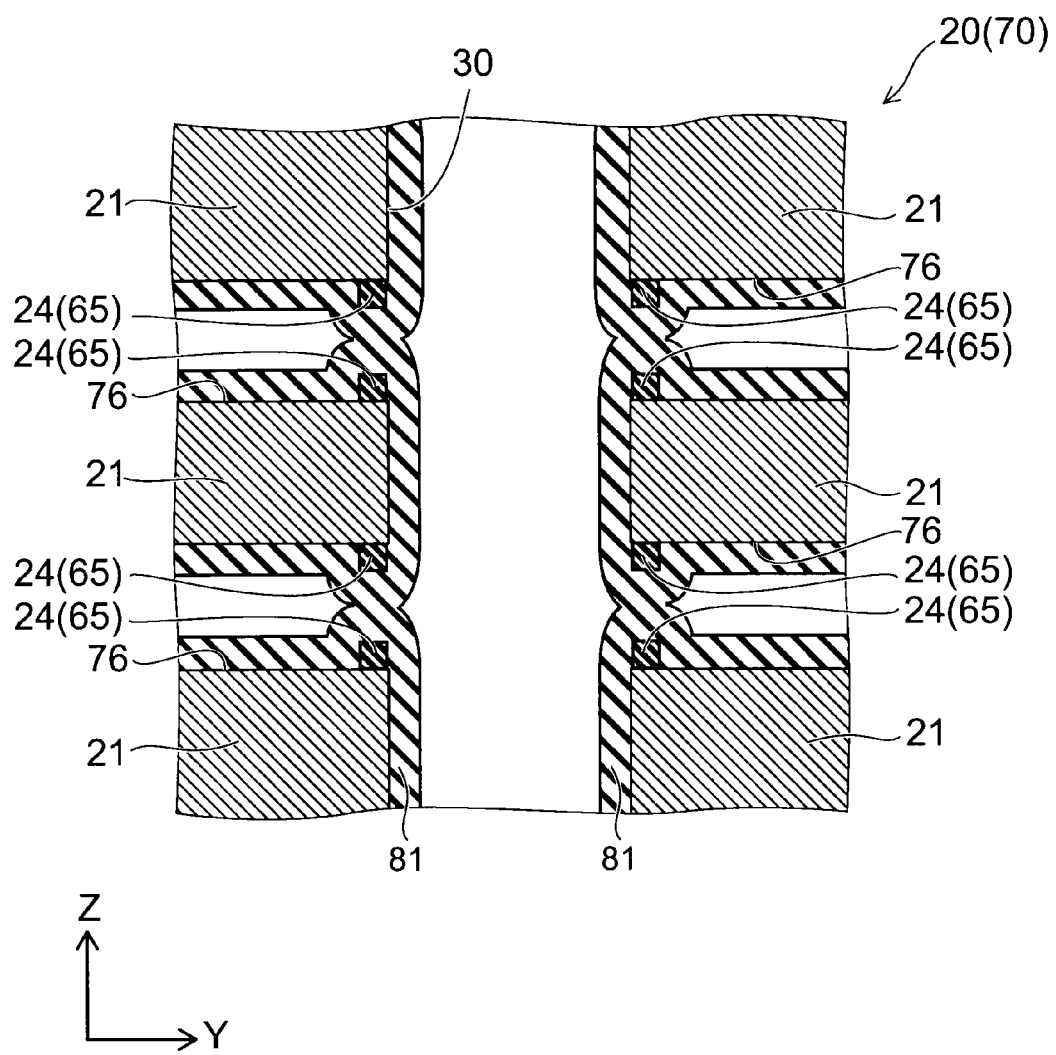
FIGS. 22 through 24 are process cross-sectional views illustrating a method of manufacturing the semiconductor memory device according to the third embodiment.
Figure 23:
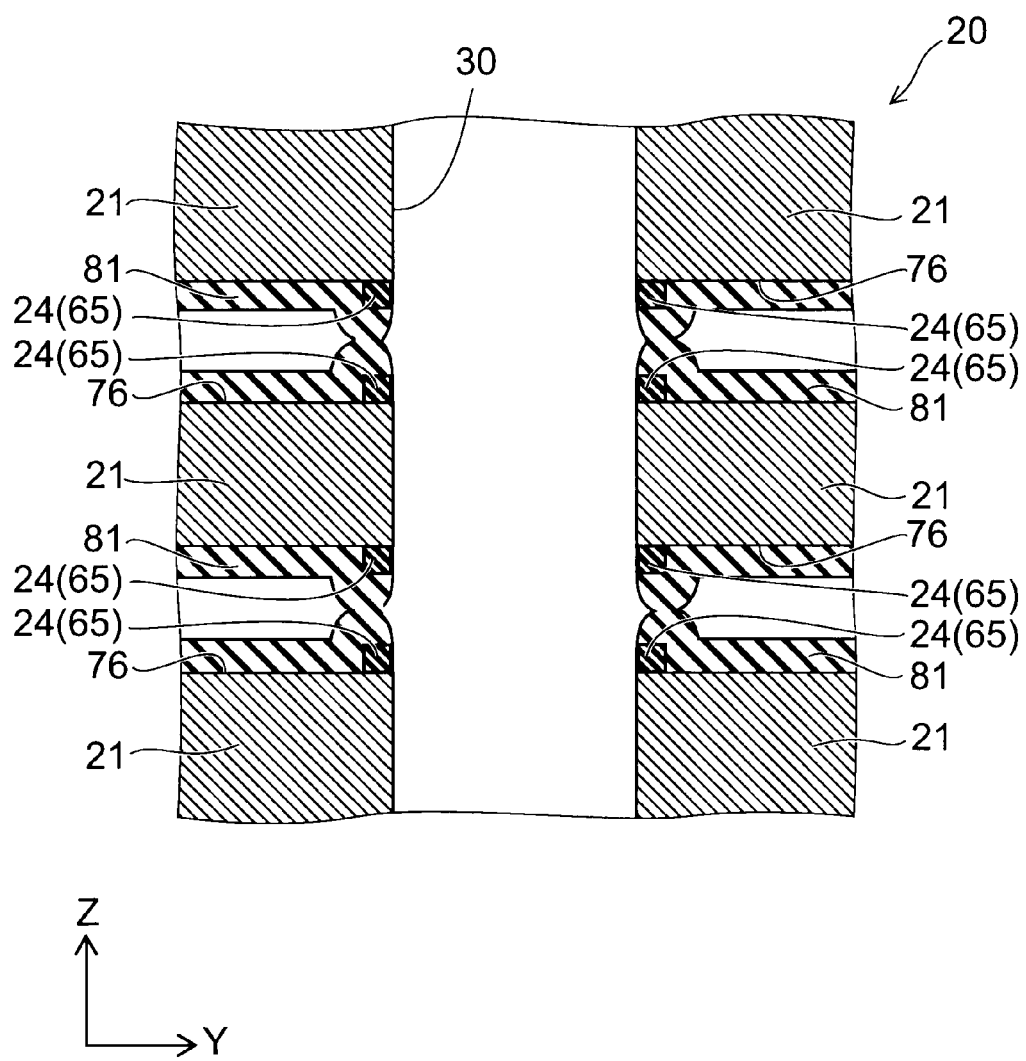
Figure 24:
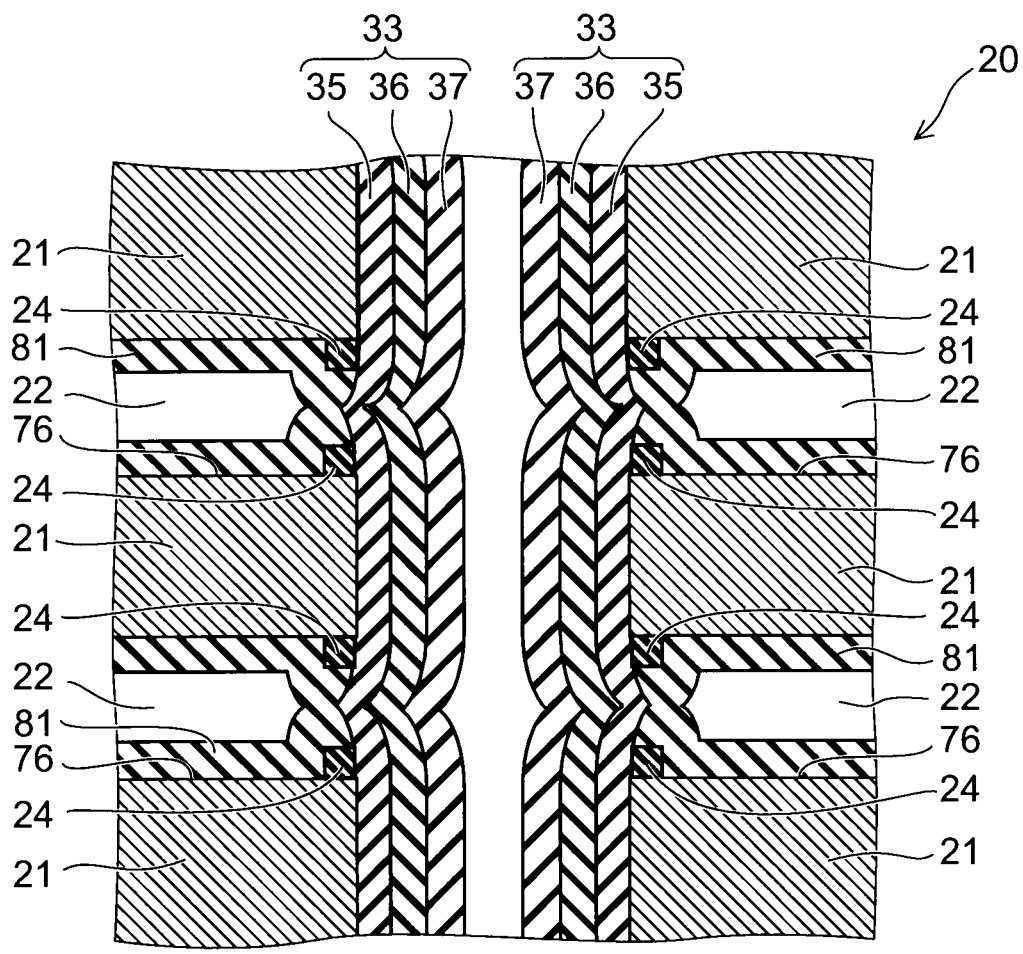

FIGS. 22 through 24 are process cross-sectional views illustrating an example of the method of manufacturing the semiconductor memory device according to the embodiment.

First, the gaps 76 between the gate electrode films 21 are formed, and the protrusions 24 are formed on the top and bottom surfaces of the gate electrode films 21 at the parts near the through holes 30, by the method illustrated in FIGS. 5 through 12, and 15 through 19.

Next, as illustrated in FIG. 22, the low permittivity film 81 is deposited, and the gaps 76 are blocked at the protrusions 24. At this time, the low permittivity film 81 covers the protrusions 24, and also is deposited on the side surfaces of the through holes 30.

Next, as illustrated in FIG. 23, isotropic etching is carried out so that the low permittivity film 81 is selectively etched rather than the protrusions 24, so that the part of the low permittivity film 81 deposited on the side surfaces of the through holes 30 is removed. At this time, the protrusions 24 remain.

Next, as illustrated in FIG. 24, the block insulating film 35, the charge storage film 36, and the tunnel insulating film 37 are formed in that order on the side surfaces of the through holes 30, to form the memory films 33. The subsequent processes are the same as for the first embodiment previously described.

For example, if the block insulating film 35 includes a silicon nitride, a silicon nitride film can be used as the low permittivity film 81. In this case, in the process illustrated in FIG. 15, silicon oxide films are formed instead of the silicon nitride films 61 and 63, and in the process illustrated in FIG. 17, the silicon oxide films are isotropically etched using hydrofluoric acid to form the indentations 64. Also, in the process illustrated in FIG. 18, silicon nitride is deposited instead of the silicon oxide 65, and isotropic etching is performed using phosphoric acid. In addition, in the process illustrated in FIG. 22, the low permittivity film 81 is formed by depositing a silicon oxide, and in the process illustrated in FIG. 23, isotropic etching is performed on the low permittivity film 81 using hydrofluoric acid. In this way, in the process illustrated in FIG. 23, it is possible to ensure the etching selection ratio between the low permittivity film 81 made from silicon oxide and the protrusions 24 made from silicon nitride.

Next, a fourth embodiment will be described.

Figure 25:
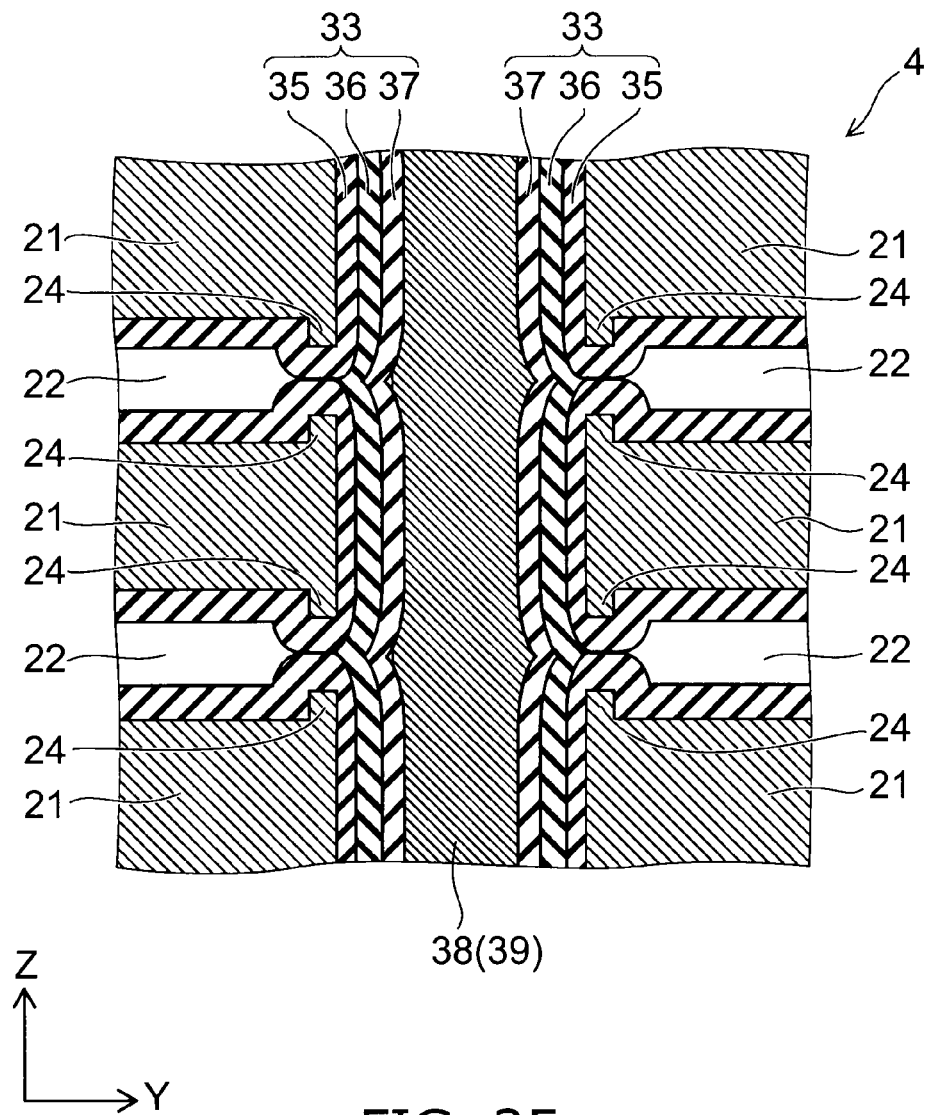
FIG. 25 is a cross-sectional view illustrating an area around a memory cell in a semiconductor memory device according to a fourth embodiment.

FIG. 25 is a cross-sectional view illustrating an area around a memory cell in a semiconductor memory device according to the embodiment.

As illustrated in FIG. 25, a semiconductor memory device 4 according to the embodiment differs from the semiconductor memory device 1 according to the first embodiment (see FIG. 3) as previously described in that the protrusions 24 are formed integrally with the gate electrode films 21. In other words, the protrusions 24 are formed using the same electrically conducting material as the gate electrode films 21.

Next, a manufacturing method for the semiconductor memory device according to the fourth embodiment will be described.

Figure 26:
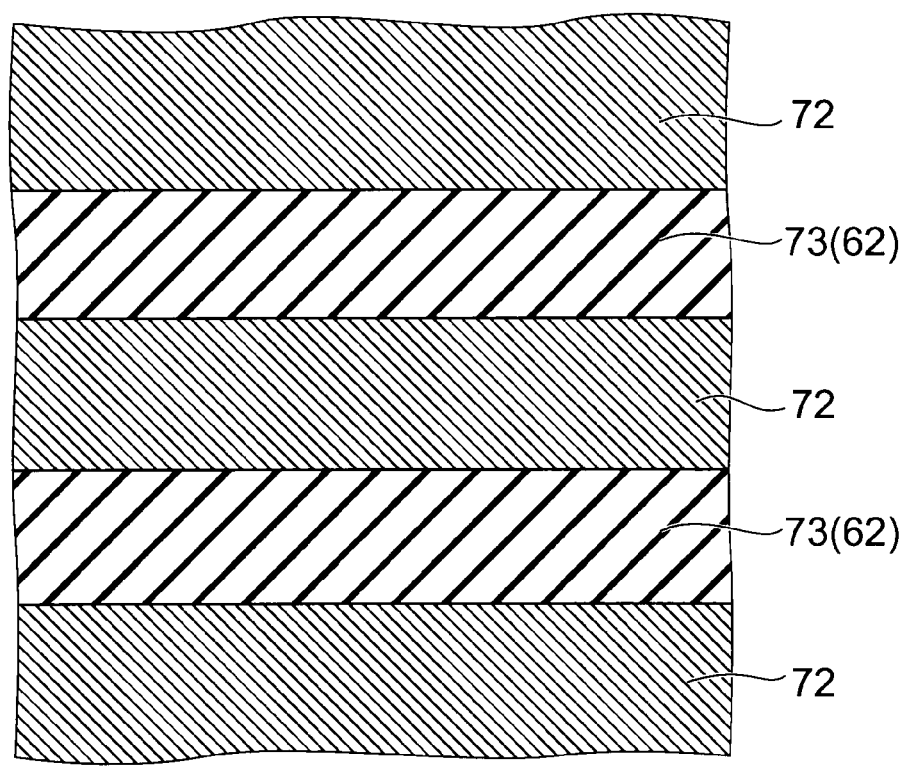
FIGS. 26 through 28 are process cross-sectional views illustrating a method of manufacturing the semiconductor memory device according to the fourth embodiment, illustrating the area around a memory cell.
Figure 26:
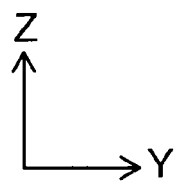
Figure 27:
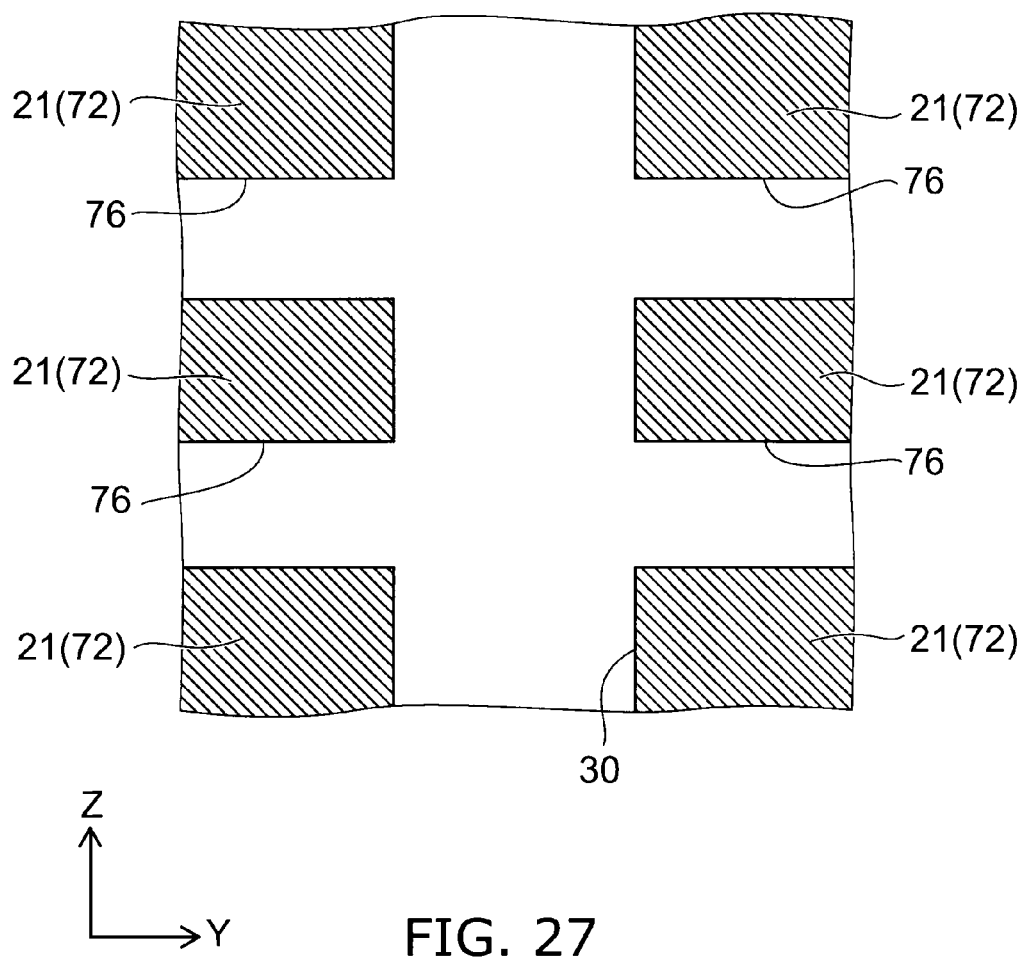
Figure 28:
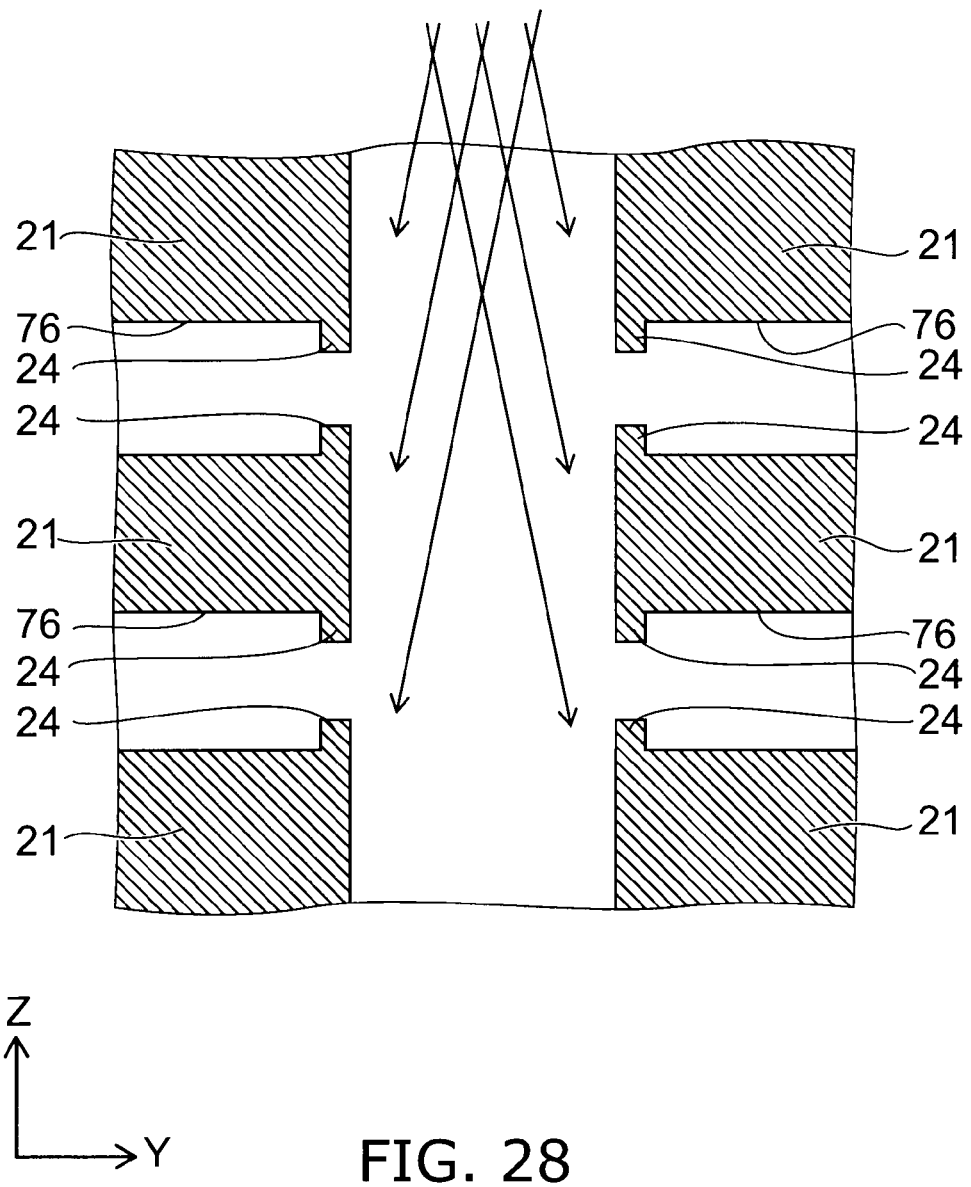

FIGS. 26 through 28 are process cross-sectional views illustrating a method of manufacturing the semiconductor memory device according to the embodiment, illustrating an area around a memory cell.

First, as illustrated in FIGS. 5A, 5B, 6A, and 6B, the silicon oxide film 13 and the back gate electrode film 14 are formed on the silicon substrate 11, the depressions 15 are formed on the top surface of the back gate electrode film 14, and the insides thereof are filled with non-doped silicon material 71, by the same method as for the first embodiment as previously described.

Next, as illustrated in FIGS. 7A and 7B, the boron doped polysilicon films 72 and the sacrificial films 73 are alternately formed on the back gate electrode film 14, to form the stacked body 70. However, at this time the sacrificial films 73 are formed from single layer non-doped polysilicon films 62, as illustrated in FIG. 26. In other words, the silicon nitride films 61 and 63 (see FIG. 15) are not formed, but the boron doped polysilicon films 72 and the non-doped polysilicon films 62 are alternately deposited.

Next, the insulating plate members 23 and the U-shaped holes 31, and so on, are formed by the same method as for the first embodiment. In other words, as illustrated in FIGS. 8A and 8B, the slits 74 are formed on the stacked body 70, and the boron doped polysilicon film 72 is divided into the plurality of gate electrode films 21. Next, as illustrated in FIGS. 9A and 9B, the slits 74 are filled with the insulating plate members 23. Next, as illustrated in FIGS. 10A and 10B, the silicon oxide film 26 and the boron doped polysilicon film 75 are formed on the stacked body 70. Then, as illustrated in FIGS. 11A and 11B, the through holes 30 are formed in the stacked body 70, linked to the depressions 15, and the U-shaped pillars 31 are formed.

Next, as illustrated in FIG. 27, wet etching is performed using, for example, hydrofluoric acid. In this way, the non-doped polysilicon films 62 (sacrificial films 73) are removed from between the gate electrode films 21 via the through holes 30, and the non-doped silicon material 71 is removed from within the depressions 15.

Next, as illustrated in FIG. 28, ion implantation of impurities is performed on the inside walls of the through holes 30. In this way, the concentration of impurities in the gate electrode films 21 at the ends near the through holes 30 is high, for example, impurities with a concentration of around $1\times10^{15}$ $cm^{-3}$ are introduced. As a result, the ends swell, forming the protrusions 24. The rest of the method of manufacturing is the same as for the first embodiment as described previously.

According to the embodiment, the stacked body 70 is formed by depositing only the boron doped polysilicon films 72 and the non-doped polysilicon films 62, and after removing the non-doped polysilicon films 62, it is possible to form the protrusions 24 at the ends of the gate electrode films 21 by just carrying out ion implantation of impurities via the through holes 30. In this way, it is possible to manufacture the semiconductor memory device 4 that includes the gaseous layers 22, by processes that are simpler than those of the first embodiment as described previously. The configuration, manufacturing method and effect of the embodiment other than that described above is the same as the first embodiment as described previously.

In each of the embodiments as described above, examples were given in which the pair of silicon pillars 39 are connected together by the connection parts 40, to form the U-shaped pillars 38, but the silicon pillars 39 may be used singly. In this case, the source lines are connected to the bottom ends of the silicon pillars 39.

Also, in the first and fourth embodiments as described above, examples were given in which the space between the protrusions 24 is blocked with the block insulating film 35, and in the second and third embodiments, examples were given in which the space between the protrusions 24 is blocked with the low permittivity film 81, but this invention is not limited to these examples. For example, the space between the protrusions 24 may be blocked by a part of the block insulating film 35 in the film thickness direction. In other words, while forming the block insulating film 35, the space between the protrusions 24 may be blocked. Or, besides the block insulating film 35, a part or the whole of the charge storage film 36 in the film thickness direction, or a part or the whole of the tunnel insulating film 37 in the film thickness direction may be disposed between the protrusions 24. In this case, provisionally assuming that the permittivity of the charge storage film 36 is higher than the permittivity of the silicon oxide film, the gaseous layers 22 are disposed between the gate electrode films 21, so the parasitic capacitance between the gate electrode films 21 is reduced as a whole. Also, the parasitic capacitance between the silicon pillars 39 is reduced as a whole. In the second and third embodiments as described above, when the charge storage film 36 is disposed between the protrusions 24, the permittivity of the low permittivity film 81 should be lower than the permittivity of the whole film disposed between the protrusions 24.

In addition, in each of the embodiments as described above, in the processes as illustrated in FIGS. 11 and 16, examples in which the through holes 30 were formed at once were described, but this invention is not limited to these examples. For example, the holes that penetrate the stacked body 70 and the holes that penetrate the control electrodes 27 may be formed by separate processes. In this case, in the processes as illustrated in FIGS. 10A and 10B, the film thickness of the silicon oxide film 26 should have sufficient film thickness to ensure a margin so that the holes that penetrate the stacked body 70 and the holes that penetrate the control electrodes 27 overlap in the Z direction. Also, the holes that penetrate the stacked body 70 may be formed by dividing the operation over a plurality of times.

Also, in each of the embodiments as described above, examples were given in which the insulating plate members 23 were provided so that they pass through the regions directly above the centers of the connection parts 40 in the Y direction, but instead of passing through the regions directly above the centers of the connection parts 40, the insulating plate members 23 may be provided so that they pass through the region directly above the region between the connection parts 40 in the Y direction. In other words, the period of arrangement of the insulating plate member 23 in the Y direction may be half the period of arrangement in the first embodiment. In this case, in the processes illustrated in FIGS. 8A and 8B, the period of arrangement of the slits 74 may be halved.

Further, each of the embodiments as described above may be combined together for use.

According to the embodiments as explained above, it is possible to realize a high speed operation semiconductor memory device and manufacturing method for same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
a plurality of gate electrode films arranged parallel to each other along a direction;
a semiconductor member extending in the direction, and passing through the plurality of gate electrode films;
protrusions (1) projecting along the direction, (2) projecting from ends of the gate electrode films closest to the semiconductor member, and (3) projecting in opposition to the semiconductor member; and
a charge storage film provided between the gate electrode films and the protrusions, and between the gate electrode films and the semiconductor member,
a gaseous layer being formed in a part of a gap between the gate electrode films.

2. The device according to claim 1, wherein the protrusions are formed from an insulating material.

3. The device according to claim 1, further comprising a block insulating film that covers the protrusions, provided between the gate electrode films and the charge storage film.

4. The device according to claim 1, further comprising:
a block insulating film provided between the gate electrode films and the charge storage film; and
a low permittivity film having a permittivity lower than a permittivity of the block insulating film, and that covers the protrusions.

5. The device according to claim 1, further comprising:
a block insulating film provided between the gate electrode films and the charge storage film; and
a low permittivity film having a permittivity lower than a permittivity of the block insulating film,
the protrusions being in contact with both of the block insulating film and the low permittivity film.

6. The device according to claim 1, further comprising:
a substrate having a top surface that is perpendicular to the direction, the plurality of gate electrode films being disposed on the substrate;
another member extending in the direction, and passing through the plurality of gate electrode films;
a connection part that connects bottom an end of the semiconductor member and an end of the another semiconductor member; and
an insulating plate member provided between the semiconductor member and the another semiconductor member, that separates each of the gate electrode films.

7. A semiconductor memory device, comprising:
a plurality of gate electrode films arranged parallel to each other along a direction;
a semiconductor member extending in the direction, and passing through the plurality of gate electrode films;
protrusions projecting along the direction from ends of the gate electrode films in opposition to the semiconductor member;
a charge storage film provided between the gate electrode films and the protrusions, and between the gate electrode films and the semiconductor member;
a gaseous layer being formed in a part of a gap between the gate electrode films;
a block insulating film provided between the gate electrode films and the charge storage film; and
a low permittivity film having a permittivity lower than a permittivity of the block insulating film, and that covers the protrusions.

8. A semiconductor memory device, comprising:
a plurality of gate electrode films arranged parallel to each other along a direction;
a semiconductor member extending in the direction, and passing through the plurality of gate electrode films;
protrusions projecting along the direction from ends of the gate electrode films in opposition to the semiconductor member;
a charge storage film provided between the gate electrode films and the protrusions, and between the gate electrode films and the semiconductor member;
a gaseous layer being formed in a part of a gap between the gate electrode films;
a block insulating film provided between the gate electrode films and the charge storage film; and
a low permittivity film having a permittivity lower than a permittivity of the block insulating film,
the protrusions being in contact with both of the block insulating film and the low permittivity film.

* * * * *